(12) United States Patent
Zimmerman et al.

(10) Patent No.: US 10,998,405 B2
(45) Date of Patent: May 4, 2021

(54) LOW-DEFECT GRAPHENE-BASED DEVICES AND INTERCONNECTS

(71) Applicant: Intel Corporation, Santa Clara, CA (US)

(72) Inventors: Paul A. Zimmerman, Phoenix, AZ (US); Ian A. Young, Portland, OR (US); Wilman Tsai, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/777,650

(22) PCT Filed: Dec. 17, 2015

(86) PCT No.: PCT/US2015/066492
§ 371 (c)(1),
(2) Date: May 18, 2018

(87) PCT Pub. No.: WO2017/105470
PCT Pub. Date: Jun. 22, 2017

(65) Prior Publication Data
US 2018/0350914 A1  Dec. 6, 2018

(51) Int. Cl.
*H01L 51/05* (2006.01)
*H01L 29/16* (2006.01)
(Continued)

(52) U.S. Cl.
CPC ........ *H01L 29/1606* (2013.01); *C01B 32/182* (2017.08); *H01L 29/0665* (2013.01);
(Continued)

(58) Field of Classification Search
CPC ........... H01L 29/1606; H01L 29/66015; H01L 29/0665; H01L 29/0669; H01L 29/41725;
(Continued)

(56) References Cited

U.S. PATENT DOCUMENTS 8,298,875 B1 * 10/2012 Or-Bach ............. H01L 29/4236
257/E21.411
8,808,810 B2  8/2014 Veerasamy
(Continued)

FOREIGN PATENT DOCUMENTS

TW  201129656  9/2011
TW  201331255  8/2013
WO  2009158552  12/2009

OTHER PUBLICATIONS

Karki et al. "First-principles DFT study for the structural stability of Hydrogen passivated graphene (H-graphene) and atomic adsorption of oxygen on H-graphene with different schemes". Central Department of Physics, Tribhuvan University, Kirtipur, Kathmandu, Nepal (2014). (Year: 2014).*

(Continued)

*Primary Examiner* — Matthew C Landau
*Assistant Examiner* — Eric K Ashbahian
(74) *Attorney, Agent, or Firm* — Green, Howard & Mughal LLP

(57) ABSTRACT

Molecular Graphene (MG) of a physical size and bonding character that render the molecule suitable as a channel material in an electronic device, such as a tunnel field effect transistor (TFET). The molecular graphene may be a large polycyclic aromatic hydrocarbon (PAH) employed as a discrete element, or as a repeat unit, within an active or passive electronic device. In some embodiments, a functionalized PAH is disposed over a substrate surface and extending between a plurality of through-substrate vias. Heterogeneous surfaces on the substrate are employed to direct deposition of the functionalized PAH molecule to surface sites interstitial to the array of vias. Vias may be backfilled with conductive material as self-aligned source/drain contacts. Directed self-assembly techniques may be employed to form local interconnect lines coupled to the conductive (Continued)

via material. In some embodiments, graphene-based interconnects comprising a linear array of PAH molecules are formed over a substrate.

18 Claims, 20 Drawing Sheets

(51) Int. Cl.
    *H01L 29/417*     (2006.01)
    *H01L 29/66*     (2006.01)
    *H01L 29/778*     (2006.01)
    *H01L 29/06*     (2006.01)
    *C01B 32/182*     (2017.01)
    *H01L 29/739*     (2006.01)
    *H01L 23/532*     (2006.01)

(52) U.S. Cl.
    CPC .. *H01L 29/41725* (2013.01); *H01L 29/66045* (2013.01); *H01L 29/66356* (2013.01); *H01L 29/7391* (2013.01); *H01L 29/778* (2013.01); *H01L 51/0595* (2013.01); *C01B 2204/22* (2013.01); *H01L 23/53276* (2013.01)

(58) Field of Classification Search
    CPC ..... H01L 2924/13088; H01L 29/78696; H01L 29/66977; H01L 51/0595; H01L 51/0045–0049; H01L 29/7613; H01L 49/006; C01B 2204/00–065; B82Y 10/00; C08K 3/04–046
    See application file for complete search history.

(56) References Cited

U.S. PATENT DOCUMENTS

| | | | |
|---|---|---|---|
| 9,550,678 B2 | 1/2017 | Schwab et al. | |
| 2007/0215861 A1* | 9/2007 | Stafford | H01L 51/0504 257/24 |
| 2010/0012929 A1* | 1/2010 | Nakano | C09K 11/06 257/40 |
| 2010/0028681 A1 | 2/2010 | Dai et al. | |
| 2010/0127312 A1* | 5/2010 | Grebel | H01L 21/0237 257/288 |
| 2011/0143045 A1 | 6/2011 | Veerasamy | |
| 2012/0132516 A1 | 5/2012 | Zimmerman | |
| 2012/0261644 A1 | 10/2012 | Dimitrakopoulos | |
| 2013/0082364 A1* | 4/2013 | Wang | H01L 25/0655 257/659 |
| 2013/0221329 A1 | 8/2013 | Liang et al. | |
| 2016/0178569 A1* | 6/2016 | Hoffman | G01N 27/4146 257/29 |
| 2017/0102358 A1* | 4/2017 | Hoffman | H01L 21/76883 |
| 2017/0148573 A1* | 5/2017 | Zhamu | H01G 11/02 |

OTHER PUBLICATIONS

Mori et al. "N-type field effect transistor based on a fluroinated graphene". Organic Electronics 9, 328-332 (2008). (Year: 2008).*
Feng et al. "Large polycyclic aromatic hydrocarbons: Synthesis and discotic organization". Pure Appl. Chem., vol. 81, No. 12, 2203-2224 (2009). (Year: 2009).*
Müllen et al. Nanographenes as Active Components of Single-Molecule Electronics and How a Scanning Tunneling Microscope Puts Them to Work. Accounts of Chemical Research vol. 41, No. 4, 511-520 (Apr. 2008) (Year: 2008).*
Karki et al. First-principles DFT study for the structural stability of Hydrogen passivated graphene (H-graphene) and atomic adsorption of oxygen on H-graphene with different schemes. Central Department of Physics, Tribhuvan University, Kirtipur, Kathmandu, Nepal (May 2014) (Year: 2014).*

International Preliminary Report on Patentability from PCT/US2015/066492 dated Jun. 28, 2018, 9 pgs.
International Search Report and Written Opinion, dated Aug. 24, 2016, for PCT Patent Application No. PCT/US15/66492.
Balandin, Alexander A. et al., "Superior Thermal Conductivity of Single-Layer Graphene", Nano Letters, 2008, vol. 8, No. 3, 902-907.
Bao, Xin-Yu, "SRAM, NAND, DRAM Contact Hole Patterning using Block Copolymer Directed Self-assembly Guided by Small Topographical Templates", 2011 IEEE, 4 pgs.
Barone, Veronica, "Electronic Structure and Stability of Semiconducting Graphene Nanoribbons", Nano Letters vol. 6, No. 12, 2748-2754, 2006.
Bernstein, Max P. et al., "UV Irradiation of Polycyclic Aromatic Hydrocarbons in Ices: Production of Alcohols, Quinones, and Ethers", Science, 283, 1135-1138, 1999.
Bolotin, K.I. et al., "Ultrahigh electron mobility in suspended graphene", Solid State Communications 146: 351-355, 2008.
Chen, Zongping et al., "Three-dimensional flexible and conductive interconnected graphene networks grown by chemical vapour deposition", Nature Materials, vol. 10, Jun. 2011, 5 pgs.
Elam, Jeffrey W. et al., "Atomic Layer Deposition for the Conformal Coating of Nanoporous Materials", Journal of Nanomaterials, vol. 2006, pp. 1-5.
Fabiane, Mopeli , "Growth of graphene underlayers by chemical vapor deposition", AIP Advances 3, 2013, 9 pgs.
Fiori, Gianluca et al., "Simulation of Graphene Nanoribbon Field Effect Transistors", IEEE Electron Dev Lett, 2010, 10 pgs.
Harada, Naoki et al., "Performance Estimation of Graphene Field-Effect Transistors Using Semiclassical Monte Carlo Simulation", Applied Physics Express 1, 2008, 4 pgs.
Huang, Bo-Chao et al., "Contact resistance in top-gated graphene field-effect transistors", Applied Physics Letters 99, 032107, 2011, 4 pgs.
Kumar, Vachan et al., "Analytical Models for the Frequency Response of Multi-Layer Graphene Nanoribbon Interconnects", IEEE IITC, 2012, 6 pgs.
Lee, Changgu et al., "Measurement of the Elastic Properties and Intrinsic Strength of Monolayer Graphene", Science, vol. 321, Jul. 2008, 5 pgs.
Liddle, J. A. et al., "Resist Requirements and Limitations for Nanoscale Electron-Beam Patterning", Mat. Res. Soc. Symp. Proc. 739 (19): 19-30.
Schwierz, Frank, "Graphene transistors", nature nanotechnology, vol. 5, pp. 487-496, 2010.
Zhang, Qin, "Graphene Nanoribbon Tunnel Transistors", IEEE EDL 29, 1344, 2008, 3 pgs.
Zhang, Yuanbo et al., "Direct observation of a widely tunable bandgap in bilayer graphene", Nature, vol. 459, Jun. 2009, 4 pgs.
Zhao, Pei et al., "Novel Logic Devices based on 2D Crystal Semiconductors: Opportunities and Challenges", IEEE 2013, 4 pgs.
Zhou, Hailong et al., "Chemical vapor deposition growth of large single crystals of monolayer and bilayer graphene", Nature Communications, Jun. 2013, 9 pgs.
Estrada, Ana C. et al., "Oxidation of Polycyclic Aromatic Hydrocarbons with Hydrogen Peroxide in the Presence of Transition Metal Mono-Substituted Keggin-Type Polyoxometalates", ChemCatChem 2011, 3, 771-779.
Jeong, Jae Won et al., "Nanotransfer Printing with sub-10 nm Resolution Realized using Directed Self-Assembly", Adv. Mater. 2012, 24, 3526-3531.
Office Action from Taiwan Patent Application No. 105136715 dated Apr. 29, 2020, 15 pgs.
Cunning, Benjamin V. et al., "Towards Determining the Interaction of Fluids with Nanostructured Carbons", 2006 International Conference on Nanoscience and Nanotechnology (ICONN), pp. 689-692.
Li, Xiaolin et al., "Chemically Derived, Ultrasmooth Graphene Nanoribbon Semiconductors", Science, vol. 319, Feb. 29, 2008, 4 pgs.
Wang, Xiao-Ye et al., "Polycyclic aromatic hydrocarbons in the graphene era", Science China Chemistry, vol. 62, No. 9, Sep. 2019, 46 pgs.

(56) References Cited

OTHER PUBLICATIONS

Wang, Xinran et al., "Room-Temperature All-Semiconducting Sub-10-nm Graphene Nanoribbon Field-Effect Transistors", Physical Review Letters, May 23, 2008, 4 pgs.
Notice of Allowance from Taiwan Patent Application No. 105136715 dated Sep. 2, 2020, 3 pgs.

* cited by examiner

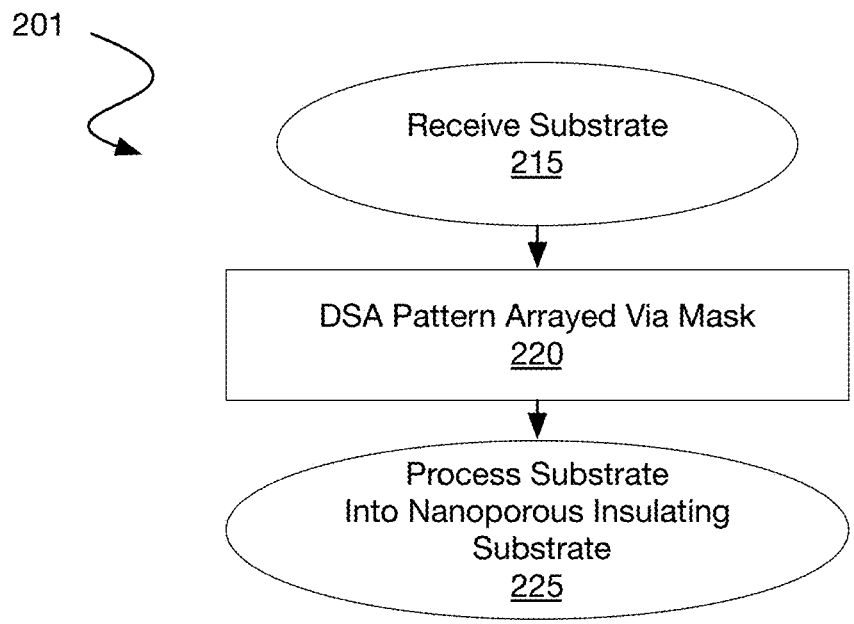
FIG. 2A
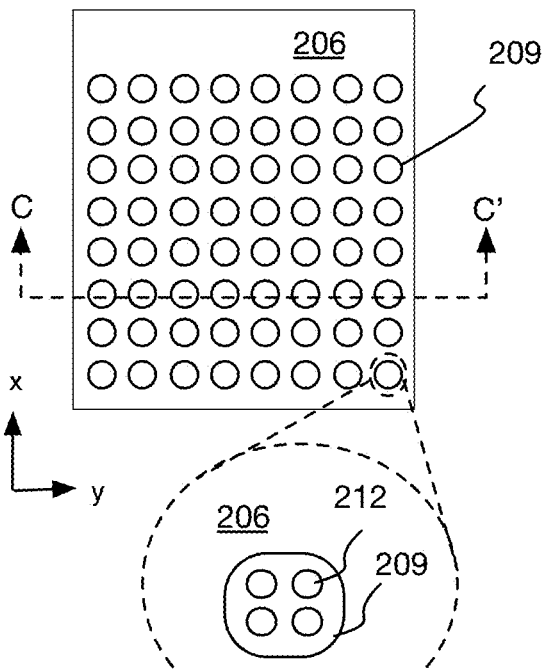
FIG. 2B
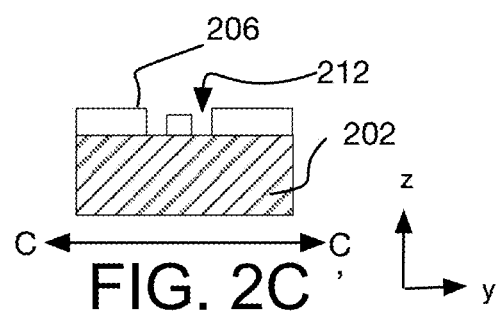
FIG. 2C
FIG. 2D
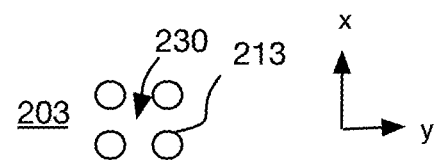
FIG. 2E

| Ion m/z | Proposed formula |
|---|---|
| 185 | $C_{14}H_{17}$ |
| 319 | $C_{24}H_{31}$ |
| 453 | $C_{34}H_{45}$ |
| 587 | $C_{44}H_{59}$ |
| 721 | $C_{54}H_{73}$ |
| 855 | $C_{64}H_{87}$ |

LOW-DEFECT GRAPHENE-BASED DEVICES AND INTERCONNECTS

CLAIM OF PRIORITY

This Application is a National Stage Entry of, and claims priority to, PCT Application No. PCT/US2015/066492, filed on 12 Dec. 2015 and titled "LOW-DEFECT GRAPHENE-BASED DEVICES & INTERCONNECTS", which is incorporated by reference in its entirety for all purposes.

BACKGROUND

There is significant interest in carbon-based structures such as graphene sheets and carbon nanotubes (CNTs) for both transistors and transistor interconnects. Graphene is a flat monolayer of carbon atoms tightly packed into a two-dimensional hexagonal lattice. Recent developments in chemical vapor deposition (CVD) technology have facilitated the deposition of continuous graphene films. However, research and simulations have predicted that graphene devices will need to have dimensions ≤7 $nm^3$ to surpass Si-based device performance. Unfortunately, this dimension indicates the most advanced patterning will be required to process a continuous film into a device having the performance promised for graphene.

Modern techniques, such as Extreme Ultraviolet Lithography (EUVL) and Electron Beam lithography (EB) may not be compatible with graphene patterning applications because of high beam energies. For example, the photon energy of EUV at 13.6 nm is 92 eV and high energy beams in EB (20-30 KeV) generate secondary electrons with enough energy to damage underlying films. A damage front of 2-3 nm from these techniques is estimated for a graphene film. This degree of damage is beyond the acceptable dimension for sub-7 nm technology as it has been shown that edge damage is detrimental to electrical properties of a graphene sheet.

As such, a conventional path to manufacturable graphene-based transistors and/or interconnects remains unclear.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIG. 2A is a flow diagram illustrating a method for preparing a substrate suitable for low-defect graphene-based devices and device interconnects, in accordance with some embodiments;

FIG. 2B is a plan view of a pre-cursor template pattern, in accordance with some embodiments;

FIG. 2C-2D are cross-sectional views illustrating a DSA-patterned anodic substrate etch process, in accordance with some embodiments;

FIG. 2E is a plan view of the DSA-patterned anodic substrate shown in FIG. 2D, in accordance with some embodiments;

DETAILED DESCRIPTION

Figure 1:
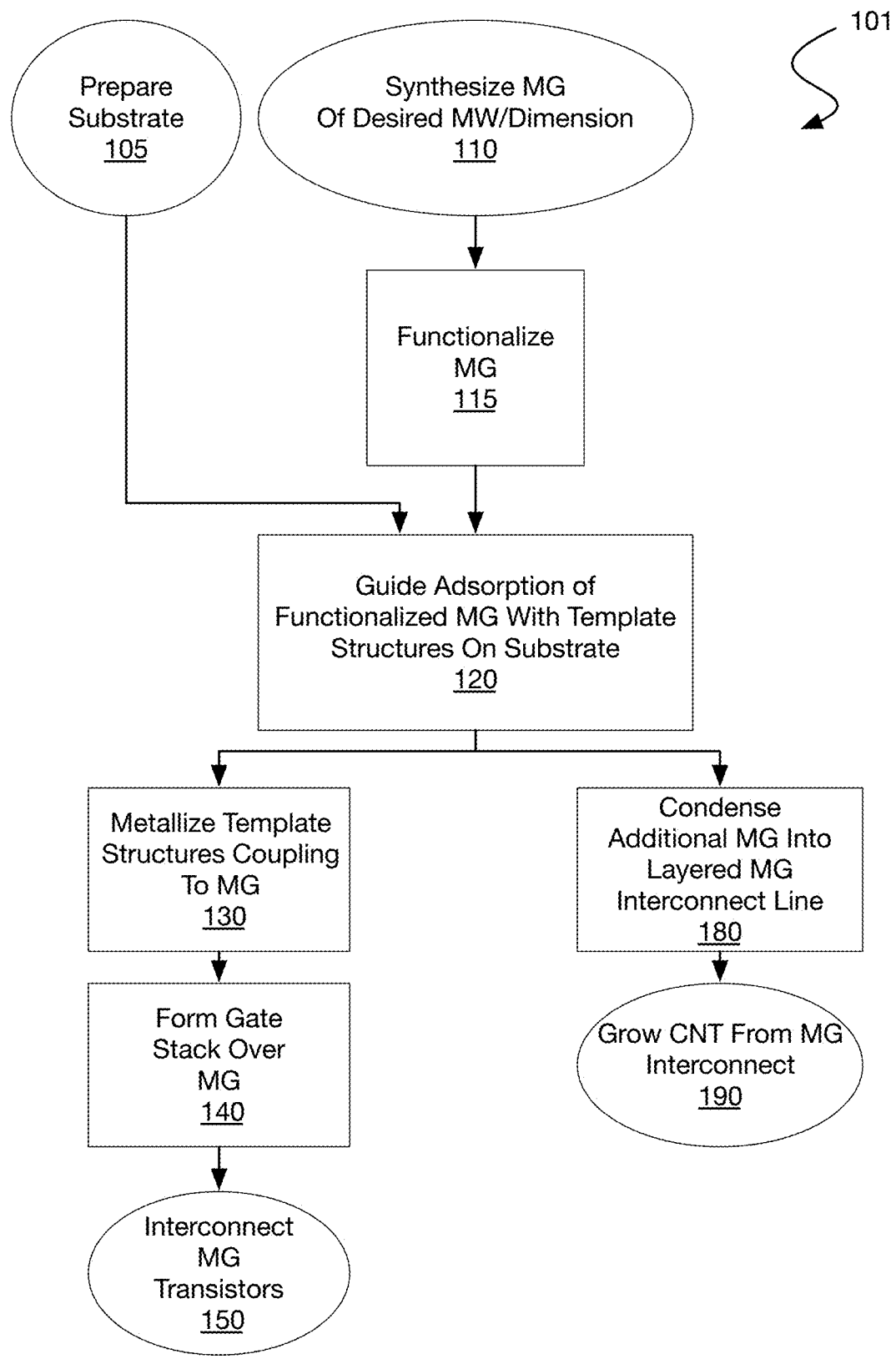
FIG. 1 is a flow diagram illustrating a method for fabricating low-defect graphene-based devices and device interconnects, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present embodiments may be practiced without these specific details. In some instances, well-known methods and devices are shown in block diagram form, rather than in detail, to avoid obscuring the features of the embodiments. Reference throughout this specification to "an embodiment" or "one embodiment" means that a particular feature, structure, function, or characteristic described in connection with the embodiment is included in at least one embodiment. Thus, the appearances of the phrase "in an embodiment" or "in one embodiment" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described herein are active devices (e.g., transistors) and passive devices (e.g., device interconnects) employing low-defect graphene-based material. In exemplary embodiments, the graphene-based material comprises molecular Graphene (MG). The MG includes graphitic molecules of a uniform molecular weight, physical size and bonding character that render the molecule suitable as a channel material in an electronic device, such as a tunnel field effect transistor (TFET). In advantageous embodiments, the graphene molecule is a large polycyclic aromatic hydrocarbon (PAH). Such a molecule is then employed as a discrete element, or as a repeat unit, within an active or passive device. The molecular graphene, when synthesized from bottom-up, will have low defects relative to materials patterned from more expansive graphene films for at least the reason that the MG has fewer, if any, of the edge defects associated with subtractive processing. The molecular graphene is ideally of a single molecular weight that is of a sufficient lateral dimension and uniform atomic bonding character (e.g., $sp^2$ with significant resonance) so as to mimic the electronic properties that have been found in more expansive graphene films.

FIG. 1 is a flow diagram illustrating a method 101 for fabricating low-defect graphene-based devices and device interconnects, in accordance with some embodiments. Method 101 begins with preparing a substrate at operation 105 with suitable template structures. At operation 110, molecular graphene of a desired structure and dimension is synthesized. The graphene-based molecules are functionalized at operation 115, for example through hydration and/or a substitution reaction. At operation 120, the functionalized molecular graphene is adsorbed onto the prepared substrate in a manner selective to the template structures. In some embodiments, method 101 proceeds to operation 130 where the template structures are selectively metallized. Method 101 then continues with formation of a gate stack over the molecular graphene, forming a field effect transistor, such as a TFET, at operation 140. The MG transistors are then interconnected, for example through the metallized template structures, into an integrated circuit. Alternatively, operations of method 101 may be re-ordered with formation of the gate stack and metallization features preceding adsorption of the molecular graphene. In some alternate embodiments, method 101 instead proceeds from operation 120 to operation 180 where additional molecular graphene is selectively deposited upon adsorbed molecular graphene, for example through a condensation reaction. Layers of the molecular graphene may form interconnects in an integrated circuit, for example interconnecting a graphene-based TFBT with other active devices, or further provide a template for subsequent CNT growth at operation 190 following any known CNT growth technique. Various operations in method 101 are described in more detail below.

FIG. 2A is a flow diagram illustrating a method 201 for preparing a substrate suitable for low-defect graphene-based devices and device interconnects, in accordance with some embodiments. In an exemplary embodiment, method 201 is practiced as part of operation 105 in FIG. 1. Method 201 entails forming nanometer dimensioned pores or vias in a substrate. In some embodiments, the pores are formed with a self-directed anodization process that also converts the substrate into a fully insulating material. Method 205 begins with receiving a substrate at operation 215. In some exemplary embodiments, the substrate is aluminum. In another exemplary metal substrate embodiment, the substrate received at operation 215 is zinc. Alternate materials may also be employed for the substrate.

At operation 220, block co-polymer mask material is applied to the substrate, for example by spin casting a solution containing the block co-polymer. A regular array of openings is then formed in the polymeric mask material following directed self-assembly (DSA) techniques. In one embodiment, for example, a mixture of polystyrene and poly(methyl methacrylate) (PS-PMMA) is applied to the substrate surface and allowed to phase separate into an array of regularly spaced and dimensioned features. In some embodiments, a substrate with no precursor topography is DSA-patterned directly.

FIG. 2B-further illustrates patterning a substrate to form pre-cursor template features and/or topography. For example, a conventional lithography process may be employed to form an array of recesses 209, each having a diameter on the order of a hundred nanometers. Recesses 209 may be patterned with a diameter predetermined to induce a desired number of DSA openings within the recess. Recesses 209 may be formed, for example, in a mask material 206, which may be organic (e.g., carbonaceous hardmask), or inorganic (e.g., $Si_3N_4$). A co-polymer mixture is then spin-cast onto the patterned substrate surface. Following the DSA process in which one of the polymer phases is selectively removed, a plurality of openings 212 in the remaining polymer phase may be arrayed within each pre-cursor recess 209. In one example of FIG. 2B, four DSA openings 212, each having a diameter in the range of 10-15 nm, is present in the polymeric DSA mask within one pre-cursor recess 209. The pitch and/or the spacing between DSA openings 212 may be well-controlled to a predetermined dimension, for example <2 nm. In some advantageous embodiments, a molecular graphene is to be disposed over the substrate surface at an interstitial position between adjacent nanometer dimensioned features defined by the DSA opening pitch. The pitch between adjacent DSA openings 212 may therefore be scaled as a function of dimensions of the target molecular graphene.

At operation 225 (FIG. 2A), the DSA-masked substrate is processed into a nano-porous material. In exemplary embodiments, continuous pores pass through the entire z-thickness of the substrate. For a metal substrate embodiment, operation 225 may entail any known anodization process in which the metal substrate is completely converted into anodic oxide. For example, a membrane of anodic aluminum may be formed by processing a DSA-masked aluminum substrate through an oxalic acid wet etch followed by a chlorine and/or phosphoric clean-up etch to remove any unoxidized aluminum for a fully-insulating anodic-aluminum oxide substrate 203 (FIG. 2D). In the presence of nanometer DSA mask openings 212, a controlled-pattern of nanometer through-substrate vias (nano-TSV) 213 are formed rather than a random pore array typical of unmasked anodization etch processes. In the example shown in FIG. 2E, a target substrate surface site 230 is an interstitial position within four nearest nano-TSVs 213 in a 2D array. Dimensions of the TSV array are predetermined so that target surface site 230 can be spanned by a single molecular graphene.

Figure 3A:
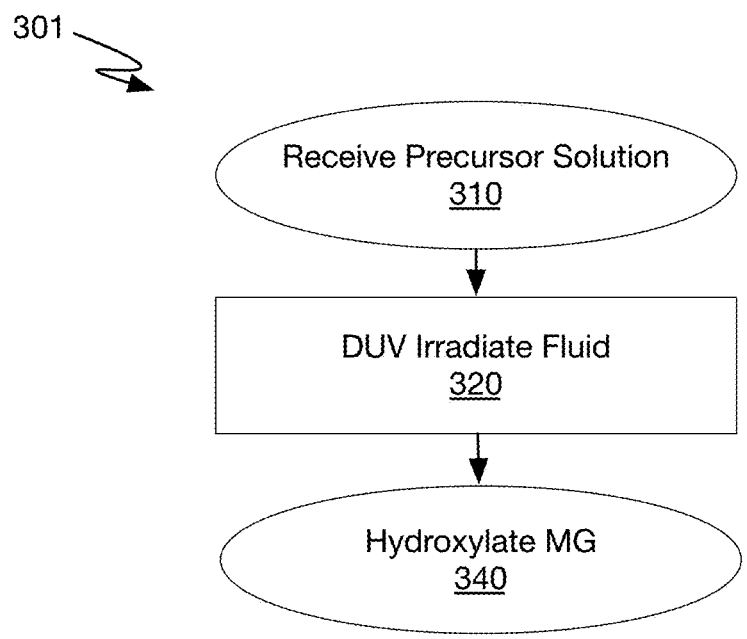
FIG. 3A is a flow diagram illustrating a method for synthesizing a solution with molecular graphene suitable for fabricating low-defect graphene-based devices and device interconnects, in accordance with some embodiments.

FIG. 3A is a flow diagram illustrating a method 301 for synthesizing a solution of molecular graphene suitable for fabricating low-defect graphene-based devices and device interconnects, in accordance with some embodiments. In an exemplary embodiment, method 301 is practiced as part of operation 110 in FIG. 1. Method 301 entails irradiating an organic pre-cursor solution with deep ultra violet (DUV) energy. In some exemplary embodiments, the technique employed in method 301 is based on the disclosure found in U.S. Patent Application 20120132516, titled "Synthesis of Graphene Films from Cycloalkanes."

At operation 310, a precursor solution is received. The precursor solution comprises a cyclic organic compound, such as an aromatic or alicyclic compound. In some embodiments, the cyclic organic compound comprises a 5-, 6-, or 7-membered alicyclic ring. In some further embodiments, the cyclic organic compound is selected from the group consisting of cyclohexane, decalin, and bicyclohexyl. Other aromatics may also be suitable, such, as but not limited to benzene and hexadecahydropyrene. The precursor solution preparation may include purification. In one example, to prepare an exemplary cyclohexane precursor solution, four liters of Aldrich Spectroscopic grade cyclohexane, (melting point pure 6.55° C.) is recrystallized once to yield two liters of solid. The solid (melting point 4.1° C.) is separated from the bulk, melted and shaken with a 3:1 mixture of concentrated sulfuric and nitric acids at 10° C. to remove aromatic and unsaturated impurities. After separation of the acid layer, the cyclohexane is washed with sodium hydroxide solution and distilled water prior to distillation. This yields about 500 ml of dry distillate (melting point 5.0° C.), which is stored over sodium wire. The obtained material is degassed to the point where the $O_2$ concentration is <1 ppm. Compounds such as naphthalene, anthracene, pyrene and other polyaromatic hydrocarbons may be added to a solution in order it enhance the formation of a graphene film. The solution can contain 5% to 15% by weight of any of these materials, however are optional as accelerators of the graphene formation process which will occur even in they're absence (e.g., with pure cyclohexane).

Figure 3B:
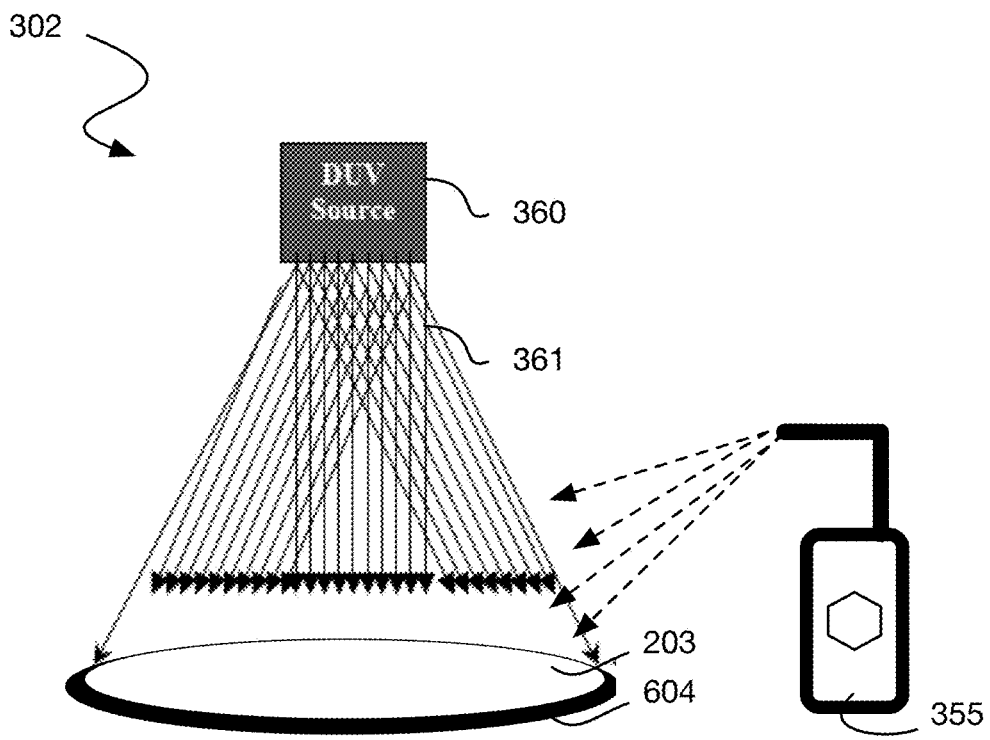
FIG. 3B is an apparatus performing an operation in the method illustrated in FIG. 3A, in accordance with some embodiments.

At operation 320, the precursor solution is irradiated with DUV. In exemplary embodiments, the DUV source wavelength ($\lambda$) is less than 254 nm, and advantageously no more than 193 nm. Such energy levels are known to be capable of disrupting carbon-carbon chemical bonds. In some exemplary embodiments, the source is a 4-kHz ArF excimer laser at a fluence between 1 and 5 $mJ/cm^2$/pulse. However, other DUV operating parameters may be employed, as embodiments herein are not limited in this respect. The precursor fluid may be irradiated in-bulk upstream of its application to a substrate, or may be irradiated in-situ as the precursor fluid is applied to a substrate. FIG. 3B depicts an apparatus 302 performing operation 320, in accordance with some in-situ irradiation embodiments. Apparatus 302 includes a DUV source 360, such as an ArF laser operating at 193 nm, oriented to emit radiation flux 361 toward substrate stage 604. A precursor supply 355 applies precursor fluid, such as cyclohexane, to substrate 203 positioned on stage 604 in an inert atmosphere. Substrate 203 is wet with a desired quantity of precursor fluid, for example by spin-casting, and then irradiated by DUV source 360.

Figure 3C:
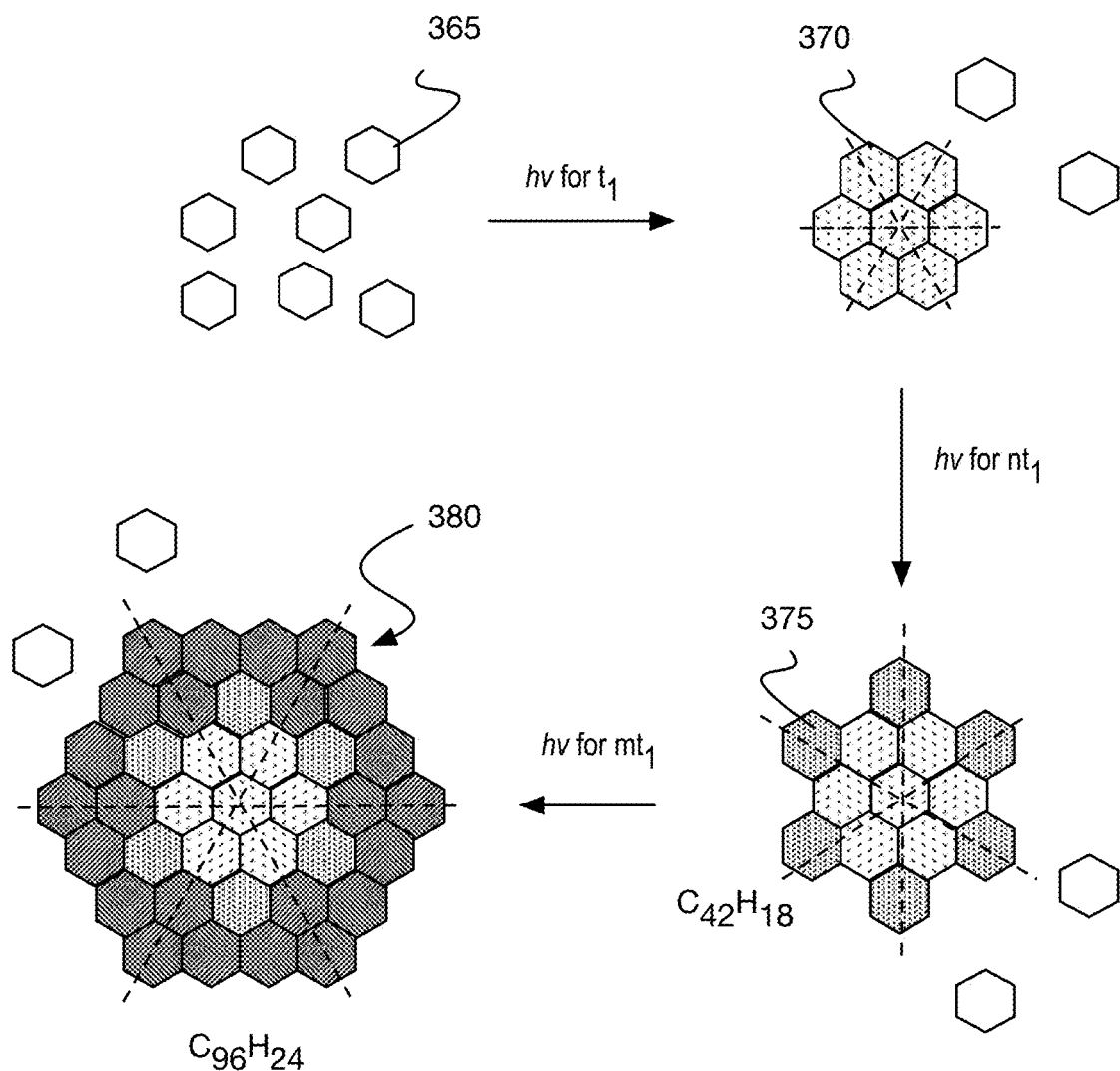
FIG. 3C illustrates PAH synthesis as a function of DUV irradiation time, in accordance with some embodiments.
Figure 3D:
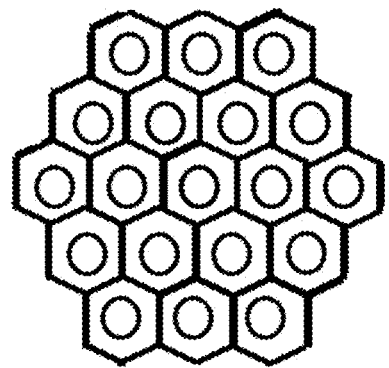
FIGS. 3D and 3E are structures of molecular graphene suitable for fabricating low-defect graphene-based devices and device interconnects, in accordance with some alternative embodiments.
Figure 3E:
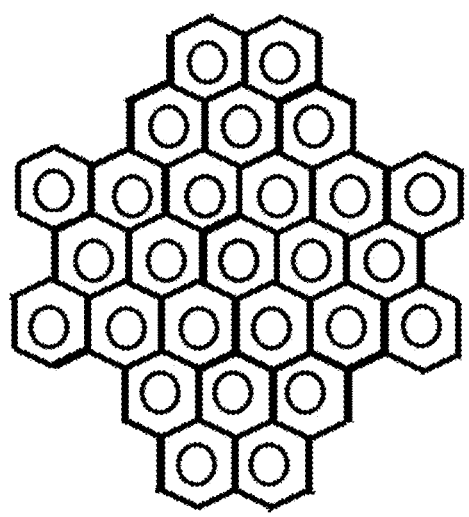

The inventors have found purified precursor fluid undergoes a reaction in the presence of DUV, which generates PAHs even in the absence of a catalyst. Although not bound by theory, it is currently understood that symmetric PAH molecules of greater size are synthesized with longer irradiation time. As such, it is possible to irradiate a quantity of precursor fluid for a time predetermined to be sufficient to synthesize a population of PAH molecules of a desired size within the fluid. FIG. 3C illustrates PAH molecule synthesis as a function of DUV irradiation time, in accordance with some embodiments. Beginning with precursor fluid containing cyclohexane 365, application of DUV energy (hv) for a predetermined time interval $t_1$ promotes synthesis of PAH molecule 370. In the exemplary embodiment, PAH molecule 370 has six-fold rotational symmetry (i.e., n-fold rotational symmetry where rotation by an angle of 360°/n does not change the object) illustrated by dashed line in FIG. 3C. Continued exposure to DUV energy for an additional time interval $nt_1$ promotes synthesis of larger PAH molecule 375. In the exemplary embodiment, PAH molecule 375 retains six-fold symmetry through the addition of five shared carbon rings to PAH molecule 370. PAH molecule 375 has a molecular formula of $C_{42}H_{19}$. Saturation has been seen to continue to decline with additional DUV energy exposure. For example, to form $C_{54}H_{18}$, the structure 376 illustrated in FIG. 3D and structure 377 illustrated in FIG. 3E.

While smaller PAH molecules may begin to have graphitic electronic properties, the molecule may not be sufficiently large to implement a transistor at geometries of a given technology node (e.g., 5 nm) and/or have a desired bandgap. As such, a larger PAH molecule 380 may be synthesized through continued exposure to DUV energy for an additional time interval $mt_1$, for example forming $C_{54}H_{18}$, $C_{76}H_{20}$, or $C_{96}H_{24}$, illustrated as PAH molecule 380. In the exemplary embodiment, PAH molecule 380 retains six-fold symmetry through the addition of twenty-four shared carbon rings to PAH molecule 375. PAH molecule 380 may mimic the properties of more expansive graphene sheets formed by other means, but lacks edge defects. PAH molecule 380 has a lateral dimension of about 1.8 nm, and will cover an area of about 4 nm². PAH molecule 380 is also attractive for graphene-based device fabrication because it is predicted to have a band gap of about 1 eV based on the screened exchange hybrid density functional (HSE) which has is known to have accurately reproduced band gaps of molecules determined experimentally. Because PAH molecule 380 is a natural derivative of graphene, it may carry equivalent physical properties like high carrier mobility, extreme mechanical strength and excellent thermal conductivity, etc. The $C_{96}$-based system is predicted to have an intrinsic bandgap of 1 eV, however a bilayer structure can be designed to permit bandgap engineering.

Figure 4A:
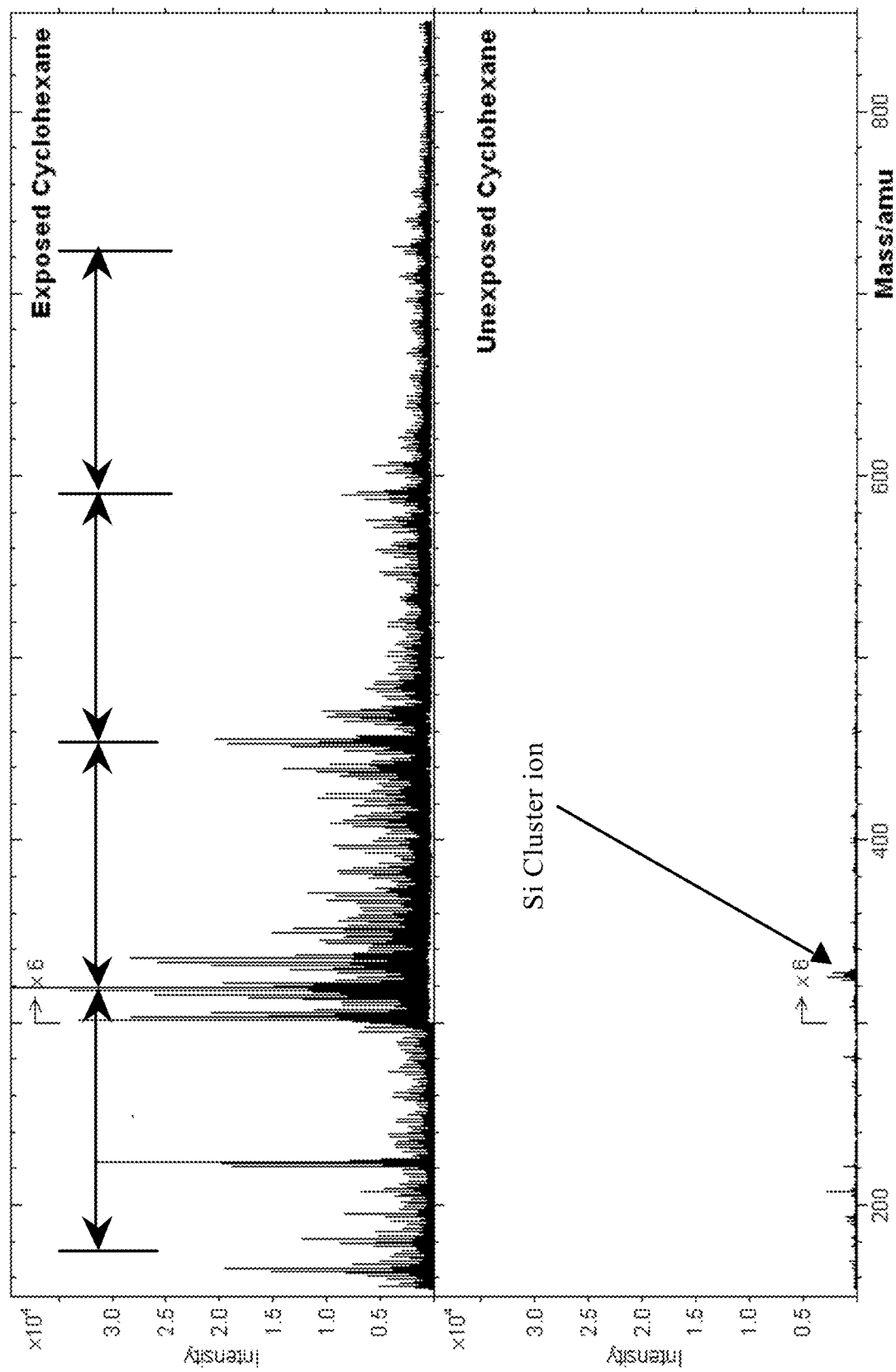
FIG. 4A includes a TOF-SIMS spectrum collected from a sample including molecular graphene suitable for fabricating low-defect graphene-based devices and device interconnects, in accordance with some embodiments.
Figures 4B, 4C:
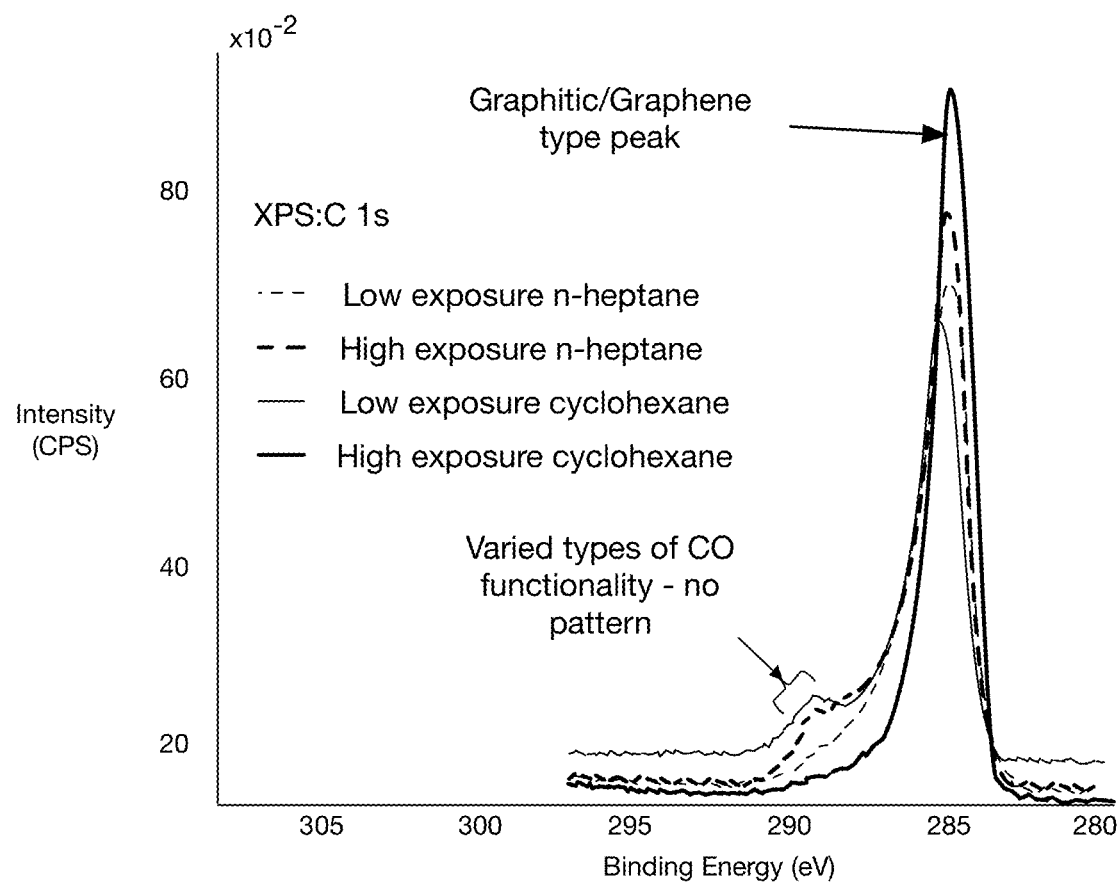
FIG. 4B is a table of molecular formulas proposed for fragments present in the TOF-SIMS spectrum of FIG. 4A.
FIG. 4C is X-ray Photoelectron Spectroscopy (XPS) output showing compositional peaks as a function of different precursor fluids and irradiation exposure times, in accordance with some embodiments.

FIG. 4A illustrates a TOF-SIMS spectrum collected from a sample including intermediary forms molecular graphene prepared by DUV irradiation, in accordance with some embodiments. To prepare the samples, drops of irradiated cyclohexane fluid samples were deposited on a silicon substrate. The fluid was evaporated leaving a solid residue on the substrate surface, which was analyzed using TOF-SIMS. Unexposed fluids were also deposited on substrate, evaporated, and analyzed as controls. FIG. 4A shows TOF-SIMS results for both exposed and unexposed cyclohexane. The intensity scales are the same for comparison purposes. The spectrum of the unexposed cyclohexane shows some trace of polydimethylsiloxane (PDMS) and the presence of Si cluster ions originating from the Si wafer substrate. The PDMS is probably a contaminant introduced during handling and is not likely pertinent. FIG. 4B is a table of molecular formulas proposed for fragments present in the TOF-SIMS spectrum of FIG. 4A. Notably, many larger fragments are observed in the exposed cyclohexane, which are absent in the unexposed fluid. As shown in FIG. 4B, several ions have a repeating set of peaks at a m/z of 134 amu ($C_{10}H_{14}$) or a m/z of 136 ($C_{19}H_{16}$). Although unclear why mass 134 is the common repeat unit(s), this repeat unit is consistent with a decalin fused ring structure with one or two double bonds indicating DUV is capable of forming highly unsaturated hydrocarbons with sp2 hybridization and resonant ring structures of large molecular weight.

Figure 4D:
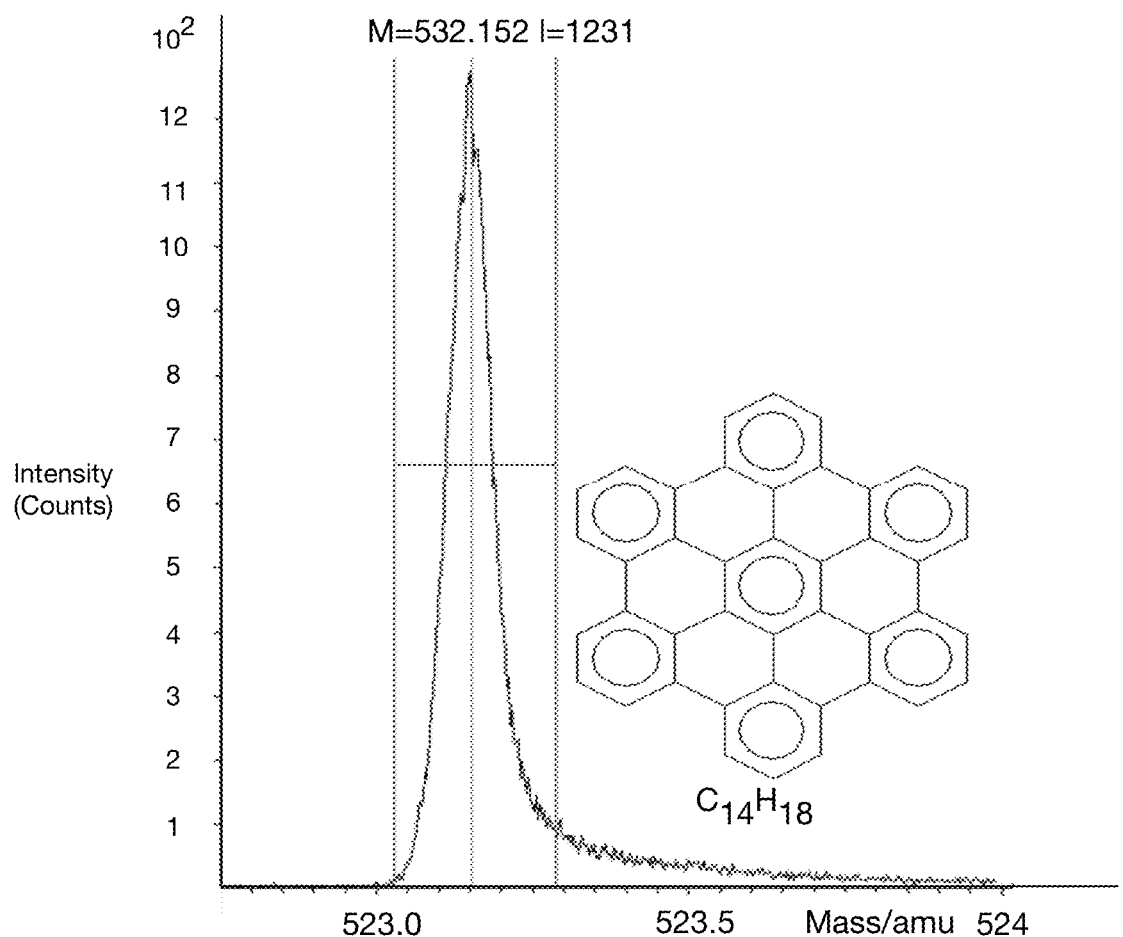
FIG. 4D is XPS output showing element composition of a sample including molecular graphene suitable for fabricating low-defect graphene-based devices and device interconnects, in accordance with some embodiments.

Upon higher exposure doses (e.g., greater than 1 J/cm2) cyclohexane is further transformed as seen in FIGS. 4C&D. FIG. 4C is X-ray Photoelectron Spectroscopy (XPS) output showing compositional peaks as a function of different precursor fluids and irradiation exposure times. As shown, the treatment of cyclohexane precursor fluid with higher DUV exposure time had the strongest graphitic peak, while n-heptane precursor fluid and cyclohexane precursor fluid with lower DUV exposure time display peaks of less graphitic character. The importance of the precursor being an aromatic is clear from the inability of DUV exposure to yield graphic components from n-heptane. FIG. 4D is XPS output showing element composition of a sample including molecular graphene suitable for fabricating low-defect graphene-based devices and device interconnects, in accordance with some embodiments. Notably, the peak is indicative of a highly unsaturated PAH with the molecular formula of $C_{42}H_{18}$ and introduced above as PAH 375. Ultimately, the level of exposure results in the specific species, such as $C_{54}H_{18}$, $C_{76}H_{20}$, or $C_{96}H_{24}$.

Figure 4E:
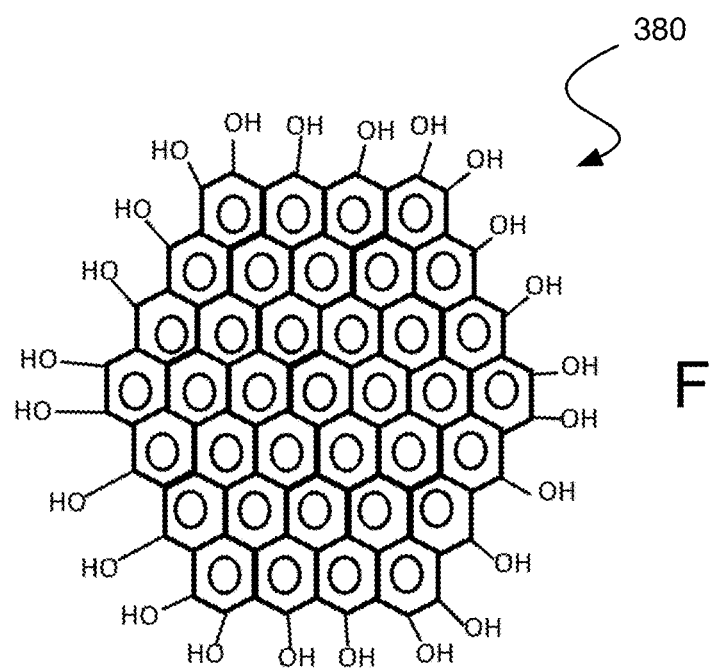
FIG. 4E is a structure for a functionalized molecular graphene suitable for fabricating low-defect graphene-based devices and device interconnects, in accordance with some embodiments.

Method 301 (FIG. 3A) is completed with a hydroxylation operation 340, which is one example of functionalizing a molecular graphene at operation 115 (FIG. 1). The PAH molecules described herein are, in-part, attractive for graphene-based device fabrication as the terminal hydrogen at the periphery can be readily converted to a functional moiety, for example through a Friedel-Crafts alkylation. Halogen (e.g., Br) or a sulfonic group can be readily substituted for most or all of the PAH hydrogen with the number of sulfonic groups or other bulky moieties limited by virtue of steric hindrance. In one advantageous embodiment, hydrogen peroxide in the presence of heat or DUV irradiation promotes hydroxylation of molecular graphene in solution. FIG. 4E further illustrates molecular structure for PAH molecule 380 following hydroxylation operation 340, in accordance with some embodiments. The functional groups (e.g., hydroxyls) can then be utilized to bind to a target substrate site. Because of the rotational symmetry, a fully functionalization periphery can facilitate controlled deposition of molecular graphene, such as $C_{54}H_{18}$, $C_{76}H_{20}$, or $C_{96}H_{24}$, onto a substrate, as described further below.

Notably, although exemplary embodiments employ DUV irradiation of a precursor, such as cyclohexane to synthesize PAH molecules suitable for graphene-based device fabrication, alternative techniques may also be employed to synthesize a PAH of desired dimension. PAH molecules of various structure may be found in diesel soot, for example, which can be processed with various known separation and/or purification techniques and placed into solution.

Figure 5:
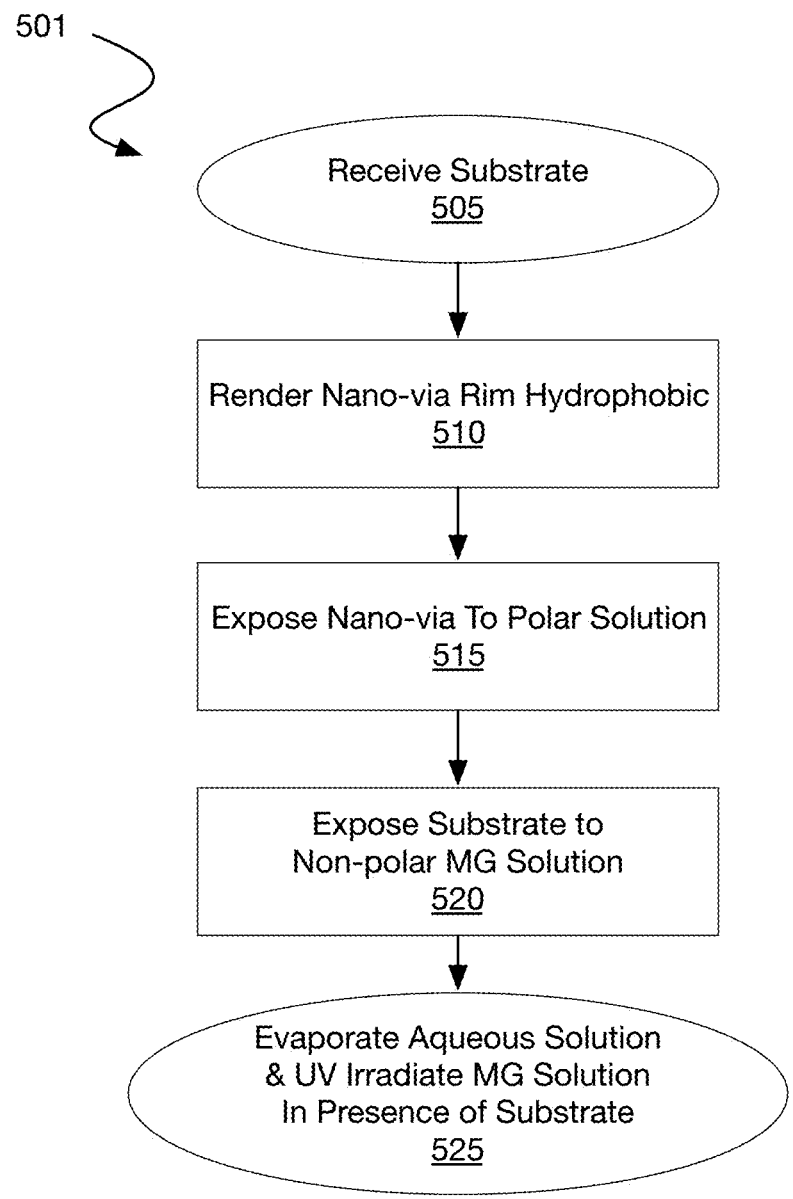
FIG. 5 is a flow diagram illustrating a method of depositing molecular graphene on a substrate with template structures, in accordance with some embodiments.

Returning to FIG. 1, method 101 continues at operation 120 where the functionalized molecular graphene is adsorbed onto a prepared substrate. FIG. 5 is a flow diagram illustrating a method 501 for depositing molecular graphene on a substrate with template structures, in accordance with some embodiments. Method 501 may be performed at operation 120 of method 101 (FIG. 1), for example. FIGS. 6A, 6B, 6C, 6D, and 6E illustrate isometric views of substrate processing and molecular graphene deposition for selected operations in method 501, in accordance with some embodiments Method 501 begins with receiving a substrate at operation 505. The substrate received may be patterned with a plurality of template structures, such as nano-vias or nano-pores. In some embodiments illustrated in FIG. 6A, the nano-vias are TSVs 213 with a diameter of approximately 10 nm, or less. The nano-TSVs 213 extend through an entire thickness of insulative substrate 203, such as anodic aluminum oxide or anodic zinc oxide, prepared as described elsewhere herein, for example. At operation 510 (FIG. 5), a portion of each nano-via proximal to a working surface of the substrate, is rendered hydrophobic to form a heterogeneous surface self-aligned to the nano-via pattern. Advantageously, a rim or ring about the working surface of each nano-via is rendered hydrophobic selectively over other regions of the substrate, which are left hydrophilic. For example, as further illustrated in FIG. 6A, a substrate backside surface 204 may be exposed to an argon cluster bombardment, which induces a hydrophobic ring 615 around the nano-TSV 213. Alternate techniques may be employed to arrive at the heterogeneous surface structure illustrated in FIG. 6B. For example, a material having suitable surface properties (e.g., MnN) may be deposited (e.g., by atomic layer deposition) onto one unmasked side of the substrate.

Method 501 (FIG. 5) continues at operation 515 where the heterogeneous substrate surface is exposed to a polar solution that will form a high contact angle at the hydrophobic surface of each nano-via. Any known wet processing technique, such as spin casting, may be employed at operation 515. In exemplary embodiments further illustrated by FIG. 6C, an aqueous solution of 3-30% hydrogen peroxide applied at operation 515 to substrate 203 forms polar liquid hemispheres 620 surrounding interstitial target substrate surface region 230, which does not wet at operation 515. At operation 520, the partially wetted substrate is further exposed to a non-polar solution of molecular graphene. Any known wet processing technique, such as spin casting, may be employed at operation 520. Upon application, the non-polar solution wets hydrophilic substrate surfaces, including target substrate surface region 230. A two-phase liquid system is formed over the substrate with a first phase comprising polar droplets disposed over the nano-TSV template structures surrounded by the non-polar solution phase. The non-polar fluid contacts the substrate only between the aqueous hemispheres, and the molecular graphene can be oriented relative to the aqueous hemispheres. A molecular graphene of sufficient lateral dimension and of sufficiently symmetrical shape (e.g., 6-fold) can be self-aligned by the adjacent nano-TSVs. As further illustrated in FIG. 6D for example, PAH molecule 380 has lateral dimensions (e.g., 1.8 nm) matched to the dimensions of an interstitial surface site between four nearest neighboring nano-TSVs 213 having a predetermined lateral spacing or pitch.

Returning to FIG. 5, method 501 continues at operation 525 where any residual solution(s) is/are evaporated. One or more of evacuation (e.g., sub-Torr) or application of heat may be employed at operation 525. In some advantageous embodiments where the solution comprises hydrogen peroxide, substrate regions rendered hydrophobic are reoxidized during operation 525. During the evaporation process, the non-polar solution is irradiated with DUV light (e.g., 193-254 nm) to promote the formation of chemical bonds between the functional groups on the molecular graphene and the substrate. For example, reactive hydroxyl radicals may be formed when a PAH with hydroxyl functional groups is exposed to DUV, and these radicals can form bonds between PAH functional groups and the substrate. The body of the molecular graphene will not be reactive to either hydroxyl radicals or DUV light. Upon fluid removal, method 501 is complete.

Figure 6A:
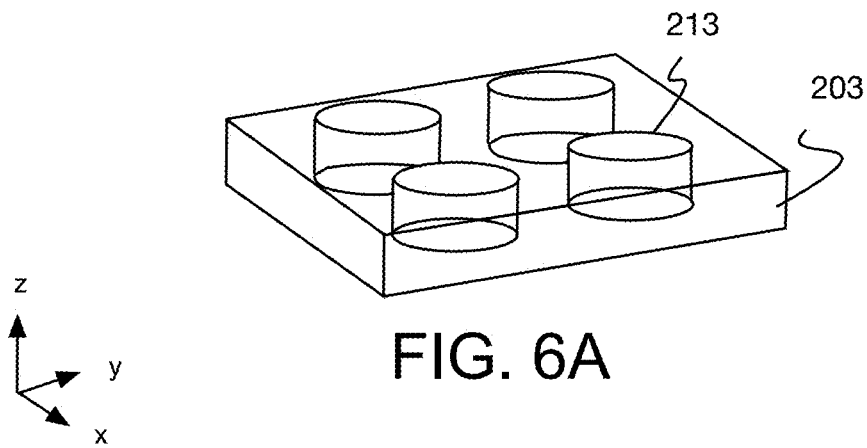
FIGS. 6A, 6B, 6C, 6D, and 6E illustrate isometric views of substrate processing and molecular graphene deposition for selected operations in the method illustrated in FIG. 5, in accordance with some embodiments.
Figure 6B:
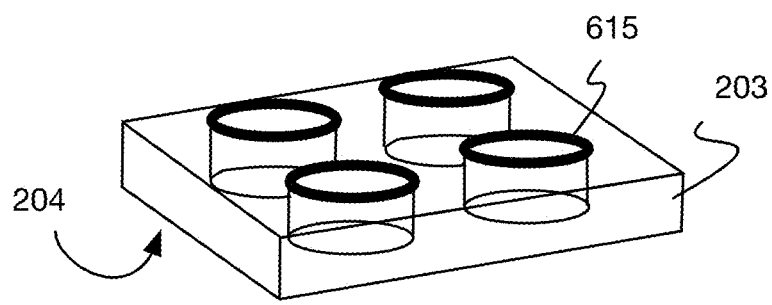
Figure 6C:
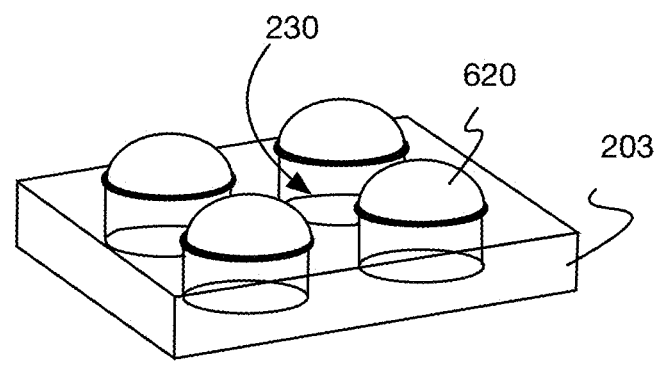
Figure 6D:
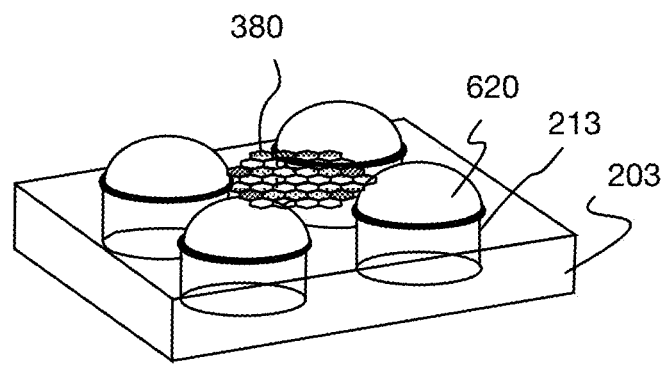
Figure 6E:
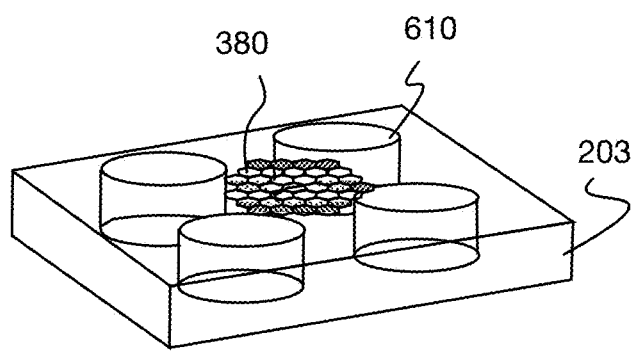

As further illustrated in FIG. 6E, PAH molecule 380 is bonded to substrate 203 at an interstitial site within an array nano-TSVs 213. PAH molecule 380 is then available as one molecular graphene positioned at a known location, which can be integrated with other substantially identical molecular graphene units that were concurrently deposited at other locations on the substrate. In some embodiments, one deposited PAH molecule is employed in a carbon-based active device. Because the molecular graphene has minimal edge effects, it is an ideal material for tunnel field-effect transistors (TFETs) since line-edge roughness is known to be very detrimental to device performance.

In some alternative embodiments, the heterogeneous substrate surface is exposed to an ambipolar solution of molecular graphene, including an ambipolar solvent such as, but not limited to, pentanol or hexanol. Functionalized molecular graphene will be tend to be surrounded by hydrophilic ends of the ambipolar solvent. The ambipolar solution may be applied to the substrate for example by spin-casting. Upon application, the ambipolar solution surrounding molecular graphene wets the heterogeneous substrate surfaces, including target substrate surface region 230, forming a single-phase liquid system over the substrate.

Figure 7:
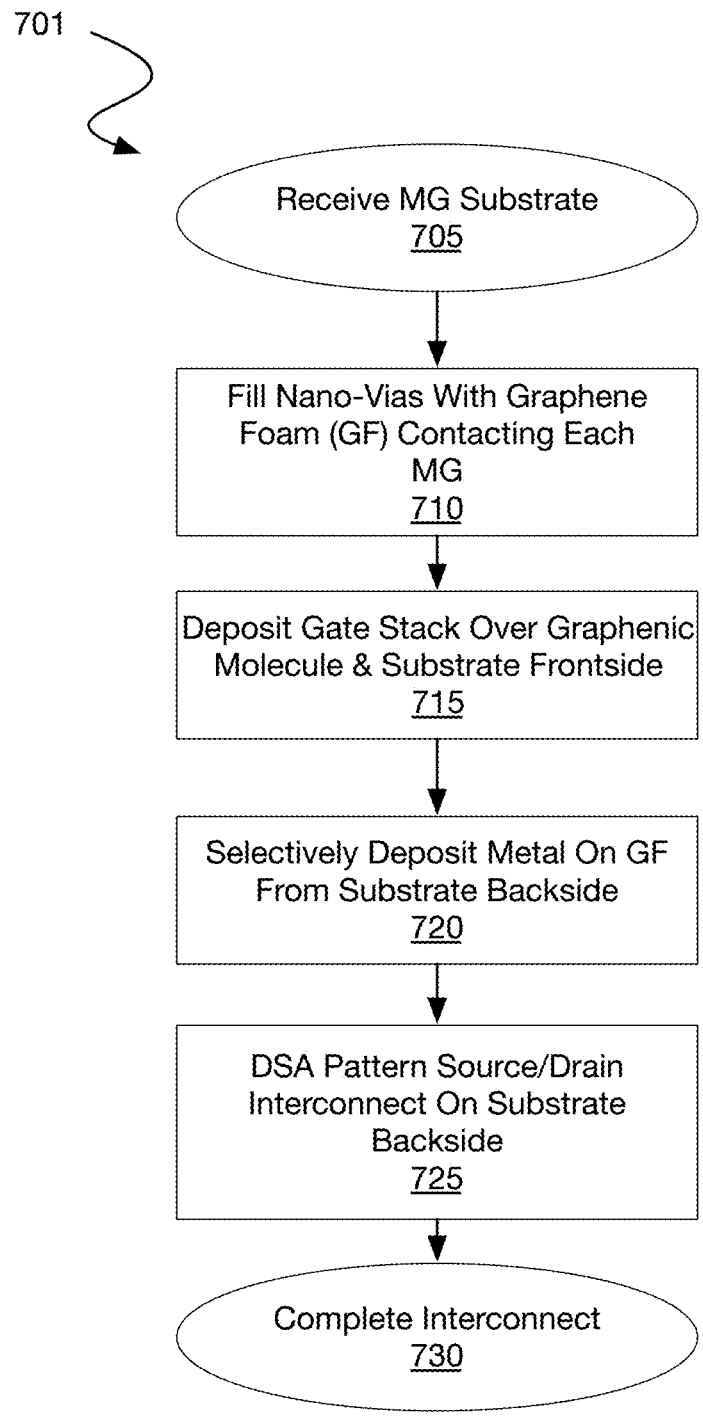
FIG. 7 is a flow diagram illustrating a method for fabricating a transistor employing a molecular graphene disposed on a substrate, in accordance with some embodiments.

FIG. 7 is a flow diagram illustrating a method 701 for fabricating a transistor employing a molecular graphene disposed on a substrate, in accordance with some embodiments. Generally, any transistor architecture based on a patterned graphene sheet may be implemented with embodiments of the molecular graphene described herein replacing a graphene sheet, and thereby mitigating/eliminating the detrimental edge effects associated with patterned graphene sheets. Both field effect transistor (FET) and tunnel FET (TFET) architectures may be implemented with embodiments of the molecular graphene described herein. FIG. 8A-8G illustrate isometric views of substrate processing for selected operations in method 701, in accordance with some further embodiments. Method 701 begins with receiving a substrate with a molecular graphene disposed on an interstitial site between a plurality of arrayed nano-via structures. In some advantageous embodiments, the substrate received at operation 705 is the end product of method 501 (FIG. 5). The single molecule of graphene received at operation 705 may serve as the channel of either a FET or TFET.

If desired, the molecular graphene received at operation 705 may be first built-up into a multi-layered structure comprising a stack of a plurality of graphene molecules. Multi-layered graphene structures (e.g., a bi-layer) may advantageously offer a means of bandgap engineering. Multiple layers may be formed at operation 705 following any technique known to be suitable for condensing molecular graphene onto an existing graphitic layer. As one example, the substrate received at operation 705 may be further exposed to a solution of functionalized molecular graphene, such as hydroxylated PAH molecules having the same structure as the molecular graphene disposed on the substrate. The functional groups may be reacted with any functional groups remaining on the first layer of molecular graphene through evaporation of the carrier solution in the presence of UV irradiation.

Figure 8A:
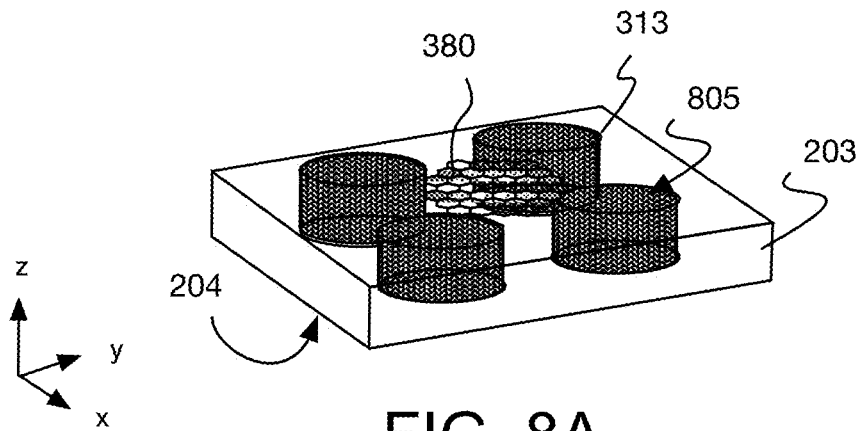
FIGS. 8A, 8B, 8C, 8D, 8E, 8F, and 8G illustrate isometric views of substrate processing for selected operations in the method illustrated in FIG. 7, in accordance with some embodiments.
Figure 8B:
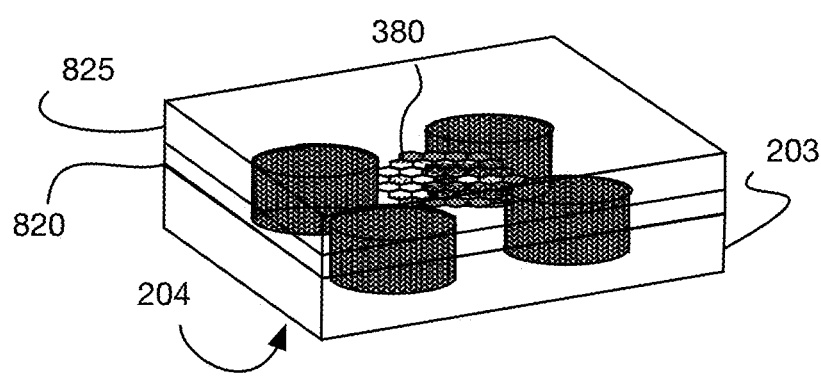
Figure 8C:
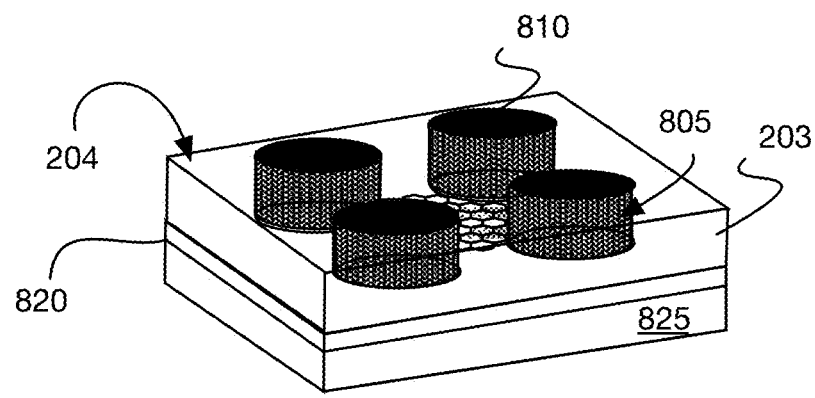
Figure 8D:
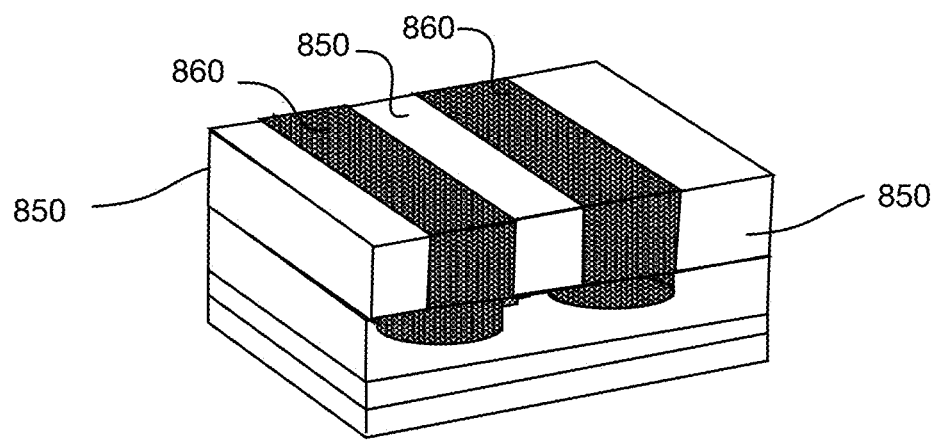
Figure 8E:
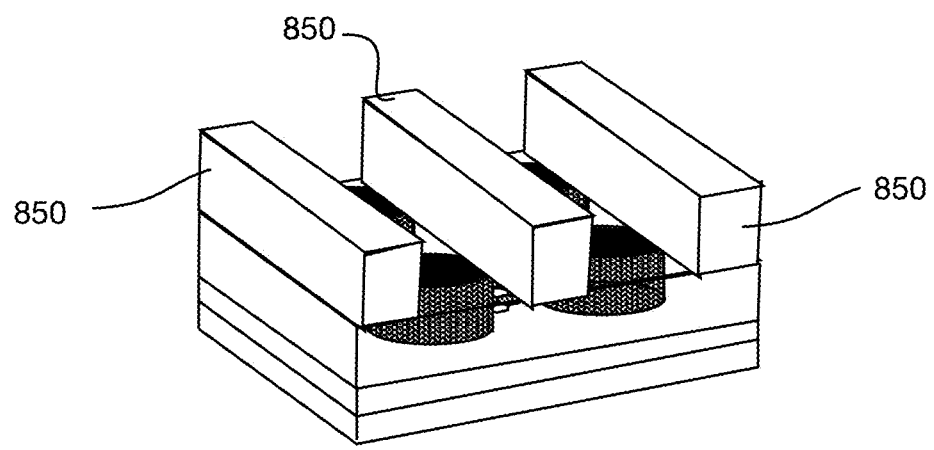

Method 701 continues at operation 710 where nano-TSVs previously employed to position the molecular graphene are now selectively backfilled with a conductive material. Because of the proximity of the molecular graphene to the nano-TSVs, the via backfill material deposited at operation 710 makes electrical contact with the molecular graphene. In some embodiments, portions of the molecular graphene accessible through the nano-TSVs are first doped as source and drain portions of the molecular graphene, which may reduce transistor channel access resistance. Any doping technique known to be suitable for graphene may be employed at operation 710. As one example, a material may be backfilled into the nano-TSVs as a source of change transfer doping. In further embodiments, the conductive material and/or source of dopant is a Graphene Foam (GF). FIG. 8A, illustrates nano-TSVs 313 filled with GF 805. Any known polymer heavily loaded with nanoparticles of graphene and/or molecular graphene may be applied to the substrate using any known technique. For example the composite polymer precursor may be spun cast from either a front or backside of the substrate, cured, and/or dried. Several composites of Graphene with PMMA or PDMS are known and many such materials have excellent conductivity.

Method 701 continues at operation 715 where a gate stack is formed over the molecular graphene and substrate frontside. Any gate stack, including for example a gate electrode material separated from the molecular graphene by a gate dielectric material, known to be suitable for modulating conductivity of Graphene by the field effect may be deposited at operation 715. In the exemplary embodiment illustrated in FIG. 8B, a high-k dielectric material 820 having a bulk relative permittivity (dielectric constant) of at least 10 is deposited over PAH molecule 380. In some embodiments, high-k dielectric material 820 is $HfO_2$, $Al_2O_3$, or $AlHfO_x$ deposited by any ALD technique known to be suitable for such materials. Any remaining hydroxyl moieties present on PAH 380 are removed during the gate dielectric deposition. A gate electrode metal 825 having a work function suitable for modulating PAH molecule 380 is then deposited over gate dielectric 820 using any known technique.

Method 701 continues at operation 720 where a metal is selectively deposited on the backfilled nano-via. In some embodiments, a seed metal, such as one or more of TiN, W, Pd, Ru, or Cu is selectively deposited on the via fill material by atomic layer deposition (ALD). As further illustrated in FIG. 8C, seed metal 810 is deposited by ALD on substrate backside 204 without depositing the seed metal on the substrate frontside.

Method 701 continues with operation 725 where source/drain local interconnect is DSA patterned on the substrate backside. Because of the small dimensions of the conductive nano-TSVs, DSA techniques are employed to pattern a first level of local interconnect lines coupling to the source and/or drain terminal of the MG channel through the conductive nano-TSVs. In some exemplary embodiments illustrated by FIG. 8D, a mix of materials 850 and 860 phase separate into a dielectric composite material 850 and a sacrificial polymer 860. In some embodiments, dielectric composite material 850 includes nanoparticles of a metal oxide, such as $HfO_2$ in a polymer matrix such as methylmethacrylate (MMA). Sacrificial polymer 860 is, for example, polyphathalate (PPTH) in propylene glycol methyl ether acetate (PGMEA). A mixture of materials 850 and 860 may be spun cast onto the substrate and thermally annealed to promote separation into a first phase of dielectric composite material 850 and a second phase of sacrificial polymer 860. In advantageous embodiments, the metal oxide nanoparticles have a diameters of ~1 nm and the MMA monomer has a length of ~0.5 nm. In advantageous embodiments, the PPTH is used in 5000 Da mass blocks, which is about 20% that of polystyrene. These materials can separate into lines on the order of 4-5 nm.

Figure 8F:
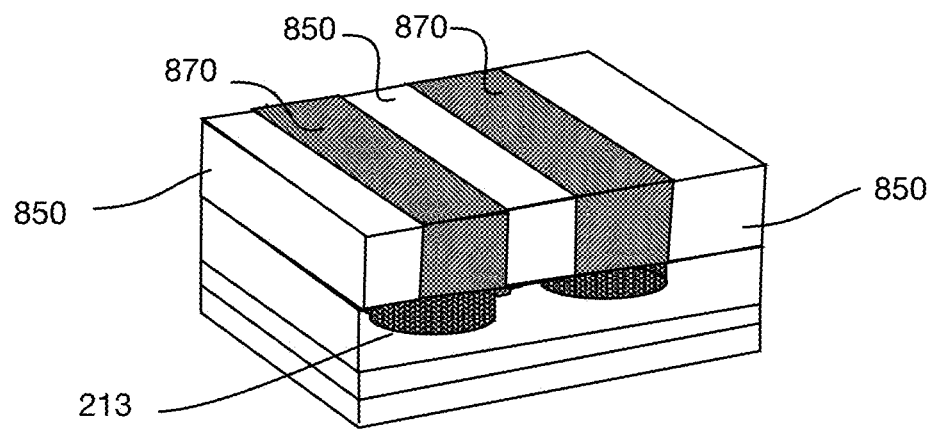

During the thermal anneal, lines of dielectric composite material 850 favors formation of continuous lines over dielectric surfaces of substrate 203 (e.g., $Al_2O_3$ surfaces) while sacrificial polymer 860 forms more readily over seed metal 810. The phase-separated material is then blanket exposed to DUV radiation (e.g., 193 nm). Upon DUV exposure, dielectric composite material 850 polymerizes into a solid having an effective relative dielectric constant ($k_{eff}$) of about 3, and organic polymer 860 decomposes into monomer components that readily evaporate, resulting in the structure illustrated in FIG. 8E. FIG. 8F further illustrates the graphic transistor cell structure following deposition of a barrier seed and bulk local metal interconnect line 870 using any known selective electrolytic and/or electroless metal (e.g., Cu) deposition techniques. In the exemplary embodiment illustrated, each local metal interconnect line 870 contacts two nano-TSVs, at least one of which is electrically coupled to PAH molecule 380.

Figure 8G:
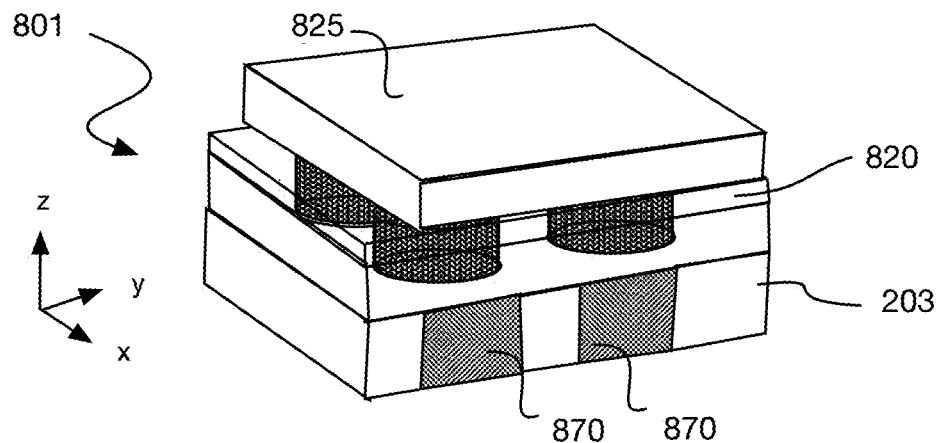
Figure 8H:
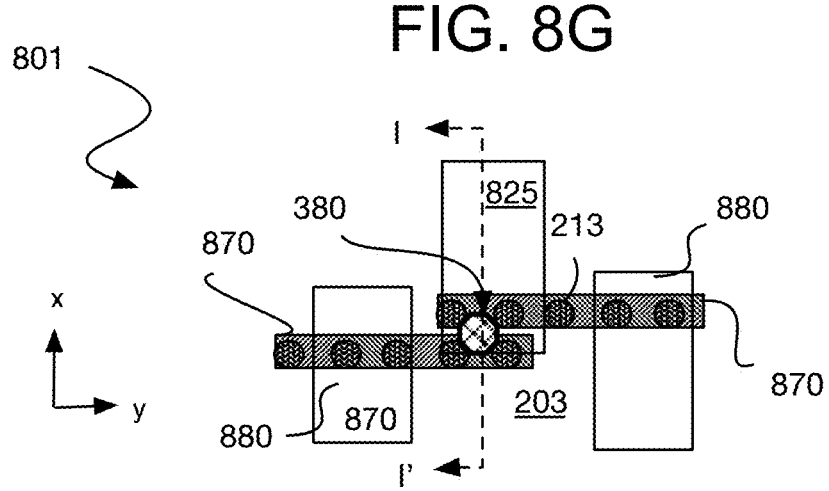
FIG. 8H is a plan view of a transistor employing a molecular graphene, in accordance with some embodiments
Figure 8I:
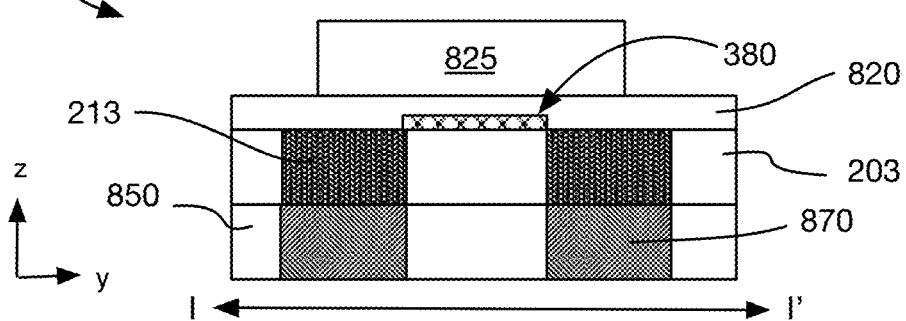
FIG. 8I is a cross-sectional view of a transistor employing a molecular graphene, in accordance with some embodiments.

Method 701 (FIG. 7) is completed with interconnecting the graphic transistor to other circuit elements at operation 730. Any known techniques may be employed at operation 730. A low-defect molecular graphene-based top-gated transistor 801 is illustrated in FIG. 8G. At this point any conventional front-side processing, such as patterning of gate electrode 825, and/or other interconnect may be employed to implement any desired circuit layout. FIG. 8H is a plan view of molecular graphene-based transistor 801, in accordance with an embodiment. As shown, conventionally patterned upper-level conductive interconnects 880 may make contact with any of the filled nano-TSVs 213 that are electrically tied to a common potential by local metal interconnect lines 870 extending over the substrate backside external to the transistor cell illustrated in FIG. 8G. FIG. 8I is a cross-sectional view of molecular graphene-based transistor 801 along the I-I' plane denoted in FIG. 8H in dashed line. As shown in FIG. 8I, gate electrode 825 is disposed on gate dielectric 820. Gate dielectric 820 is disposed over molecular graphene 380. A pair of nano-TSVs 213 extending through insulative substrate 203 make electrical contact to source/drain ends of molecular graphene 380, which may be doped relative to a channel portion of molecular graphene 380, but need not be. Local metal interconnect lines 870 extending through dielectric 850 make electrical contact to each source/drain end of molecular graphene 380 through one or more nano-TSVs 213.

Figure 9:
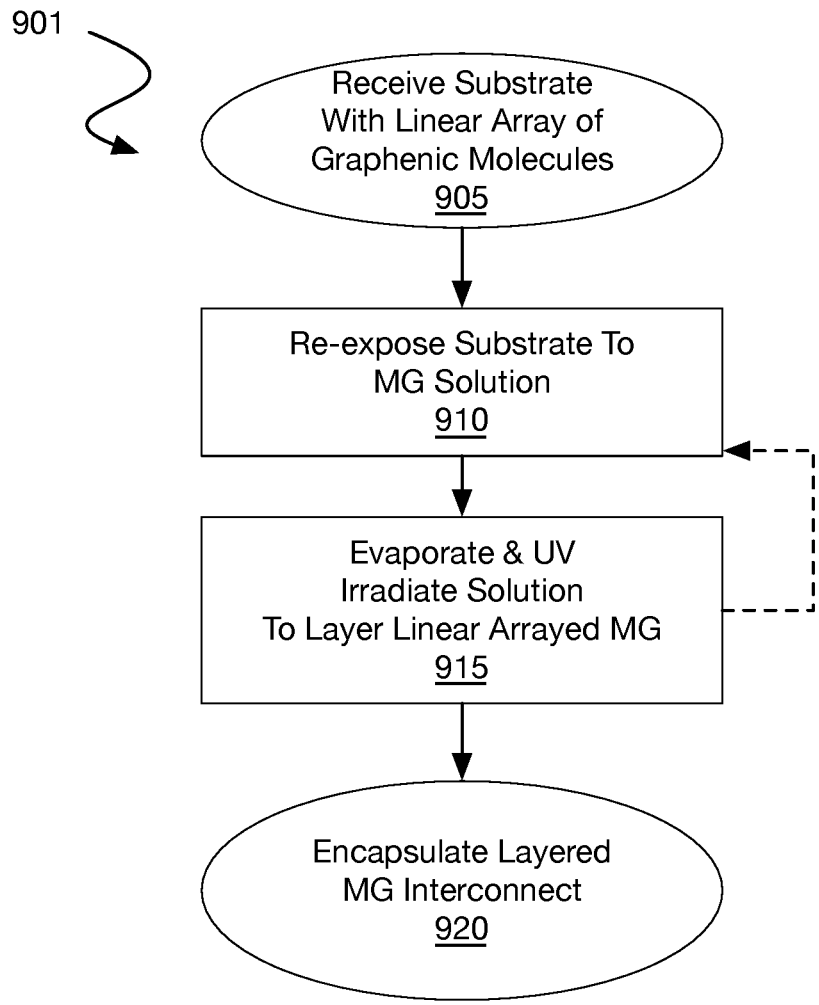
FIG. 9 is a flow diagram illustrating a method for fabricating a graphene-based interconnects, in accordance with some embodiments.
Figure 10A:
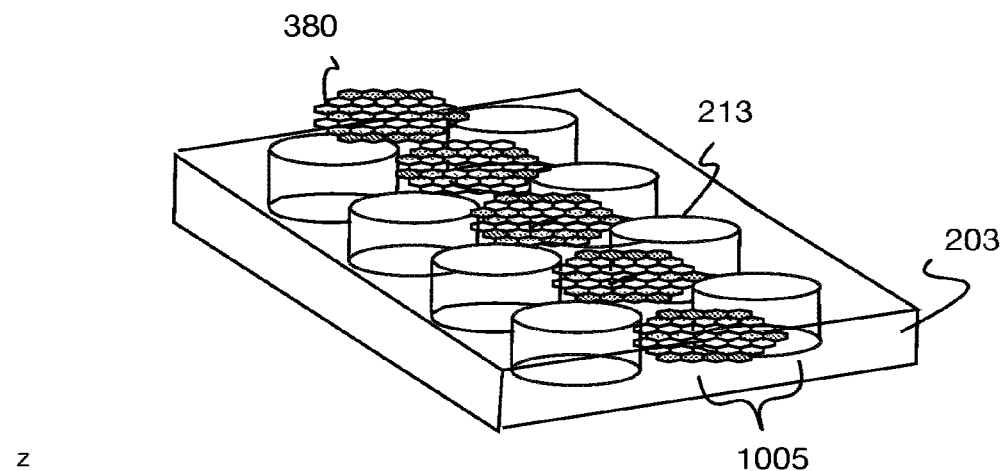
FIGS. 10A, 10B, and 10C illustrate isometric views of substrate processing for selected operations in the method illustrated in FIG. 9, in accordance with some embodiments.
Figure 10B:
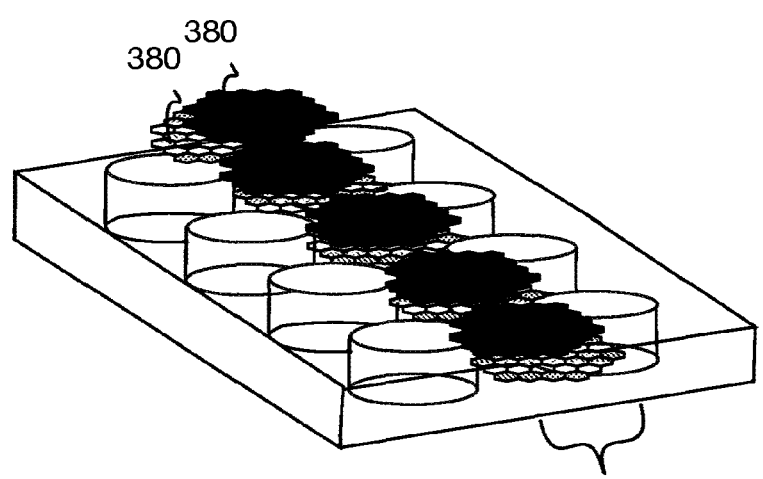
Figure 10C:
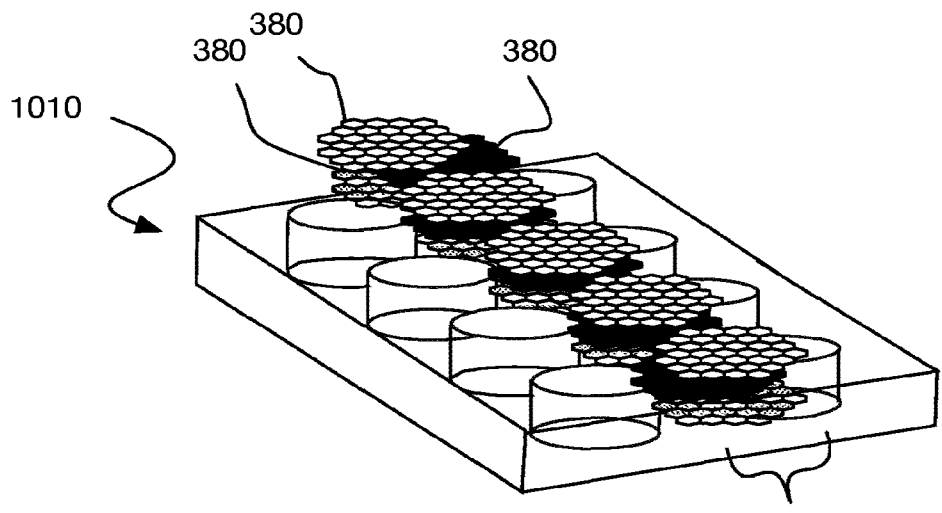

FIG. 9 is a flow diagram illustrating a method 901 for fabricating a graphene-based interconnects, in accordance with some embodiments. FIG. 10A-10C illustrate isometric views of substrate processing for selected operations in the method 901, in accordance with some embodiments. Method 901 begins with receiving a substrate with a linear array of molecular graphene disposed on a plurality of surface sites interstitial to a plurality of arrayed nano-via structures. In some advantageous embodiments, the substrate received at operation 905 is the end product of method 501 (FIG. 5). In the exemplary embodiment illustrated in FIG. 10A, substrate 203 includes a 2D array of nano-TSVs 213. A plurality of PAH molecules 380 form a linear array of molecular graphene 1005. With PAH molecule 380 having a lateral dimension of about 1.8 nm, linear array 1005 has a critical lateral dimension of 1.5 nm-2.0 nm and may have an arbitrarily long second lateral dimension (e.g., at least 100 nm). Each PAH molecule 380 is disposed at an interstitial site of the TSV array.

With an initial layer of molecular graphene defining an interconnect route, additional graphene may be seeded by the initial layer, and/or the nano-TSVs 213 may be backfilled with a conductive material to electrically link together each PAH molecule. The electrical link between adjacent PAH molecules may be with a GF, for example as described in the context of method 701 (FIG. 7). Alternatively, any technique known to be suitable for condensing additional molecular graphene onto an existing graphitic layer may be employed to ensure electrical continuity over a lateral distance many orders of magnitude longer than that of a single PAH molecule. As one example, method 901 continues at operation 910 where the substrate is further exposed to a solution of functionalized molecular graphene. In some embodiments, operation 910 entails hydroxylated PAH molecules having the same structure as those employed to form the first graphitic layer. The functional groups may be reacted with any functional groups remaining on the first layer of molecular graphene through evaporation of the carrier solution in the presence of UV irradiation at operation 915. As further illustrated in FIG. 10B, second PAH molecules 380 will then self-align and bind to locations where hydroxyl radicals can be formed on the adsorbed PAH molecules 380 to generate a multi-layered linear array of molecular graphene 1006. A multi-layer graphene-based interconnect 1010 in accordance with some embodiments is further illustrated in FIG. 10C. Graphene-based interconnect 1010 may include two or more layers of PAH molecules 380 deposited, for example, by performing operation 915 for predetermined time and/or iterating operations 910 and 915. Operation 901 is completed at operation 920 where the layered graphic interconnect is encapsulated with any known dielectric material at operation 920 using any known deposition technique.

Figure 11:
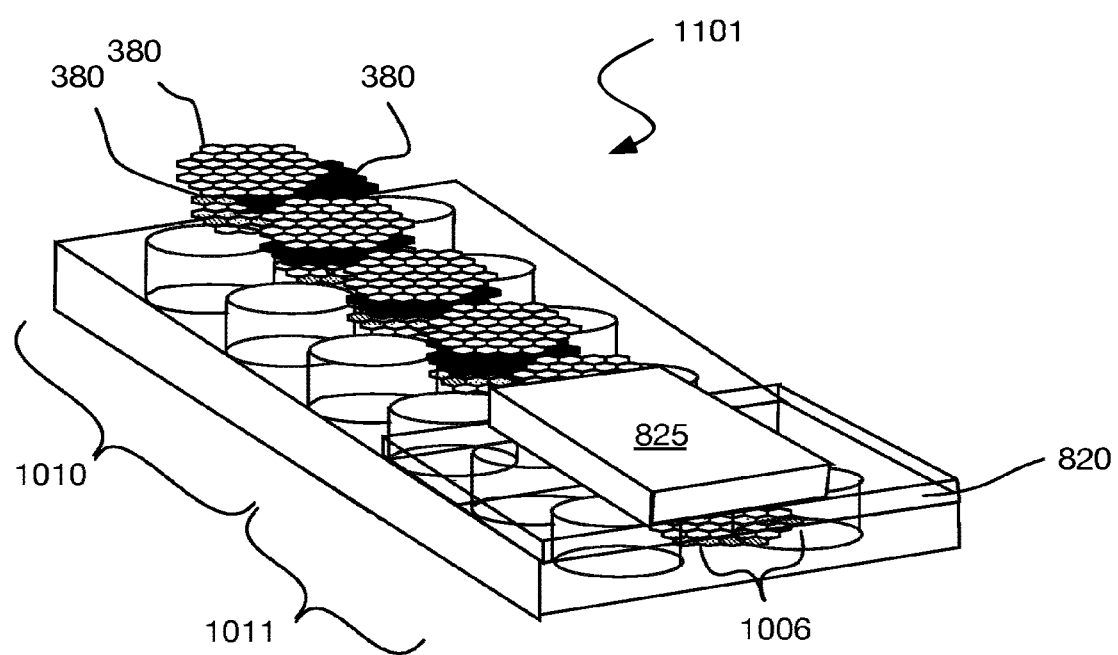
FIG. 11 is an isometric view of a low-defect graphene-based transistor coupled to a low-defect graphene-based interconnect, in accordance with an embodiment.

In some further embodiments, various operations of method 101 (FIG. 1) may be performed selectively to separate regions of a substrate, for example to form a graphene-based transistor in a first substrate region coupled to a graphene-based interconnect in a second substrate region. FIG. 11 is an isometric view of an interconnected graphene-based device 1101 including a low-defect graphene-based transistor 1101 coupled to a low-defect graphene-based interconnect 1010, in accordance with an embodiment. In this exemplary embodiment, graphene-based transistor 1101 is substantially as described above in the context of graphene-based transistor 801, but without the filled nano-TSVs. One or more PAH molecules 380 in linear array 1006 are gated through a gate stack 820, 825. The gated PAH molecule(s) source/drain is electrically coupled to a circuit destination through a remainder of PAH molecules 380 in linear array 1006.

Figure 12:
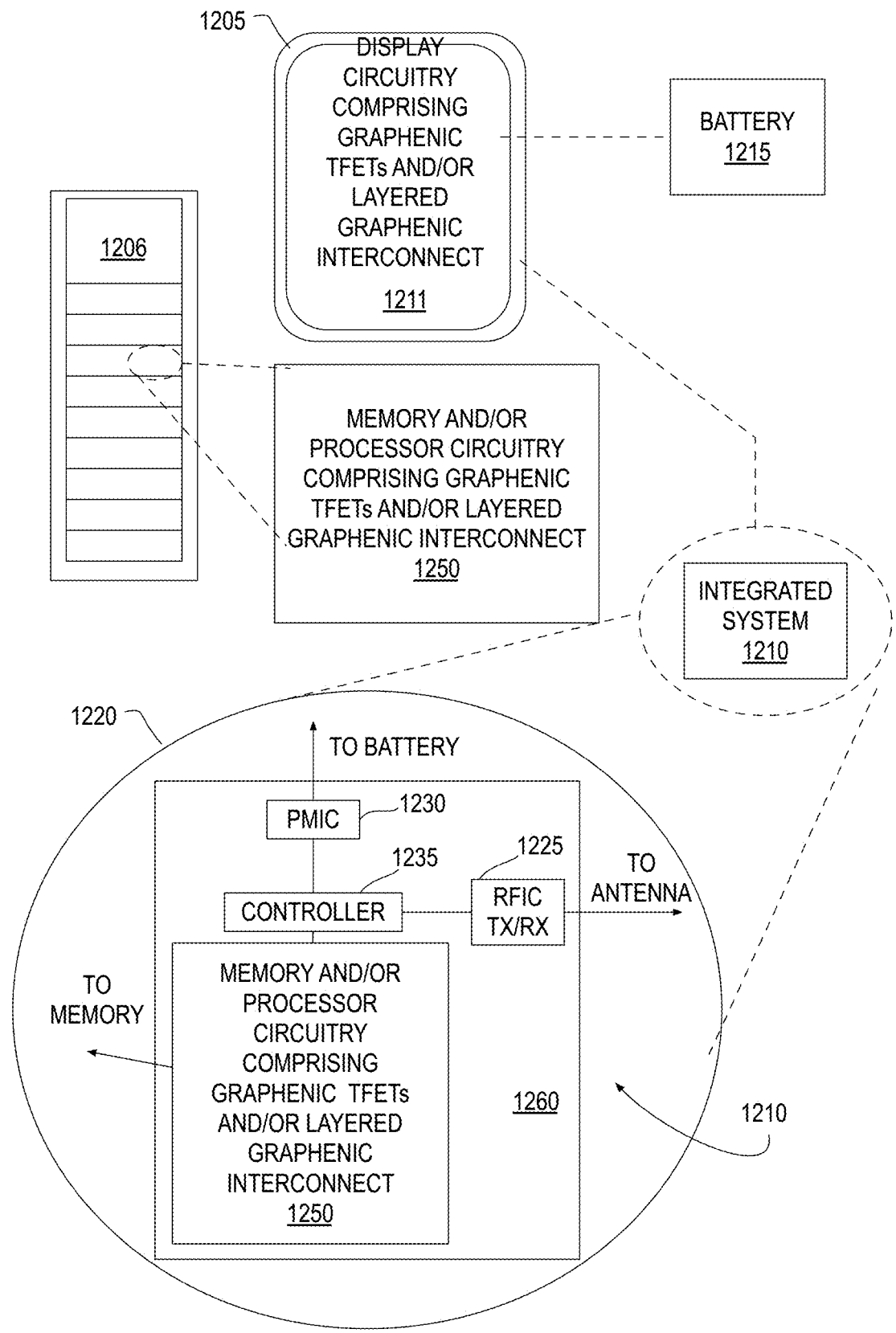
FIG. 12 is a schematic illustrating a mobile computing platform and a data server machine employing low-defect graphene-based TFETs and/or interconnects, in accordance with embodiments.

FIG. 12 illustrates a system in which a mobile computing platform 1205 and/or a data server machine 1206 employs graphene-based TFET and/or multi-layered graphene-based interconnect including one or more molecular graphene, for example a PAH molecule in accordance with embodiments described above. The server machine 1206 may be any commercial server, for example including any number of high-performance computing platforms disposed within a rack and networked together for electronic data processing, which in the exemplary embodiment includes a packaged device 1250.

The mobile computing platform 1205 may be any portable device configured for each of electronic data display, electronic data processing, wireless electronic data transmission, or the like. For example, the mobile computing platform 1205 may be any of a tablet, a smart phone, laptop computer, etc., and may include a display screen (e.g., a capacitive, inductive, resistive, or optical touchscreen) 1211, a chip-level or package-level integrated system 1210, and a battery 1215. In some embodiments, display screen 1211 includes an array of graphene-based TFETs, each including one or more molecular graphene, for example a PAH molecule in accordance with embodiments described above.

Whether disposed within an integrated system 1210 illustrated in the expanded view 1220, or as a stand-alone packaged device within the server machine 1206, an SOC 1260 includes graphene-based TFETs, each including one or more molecular graphene, for example a PAH molecule in accordance with embodiments described above. SOC 1260 may further include a memory circuitry and/or a processor circuitry 1240 (e.g., SRAM, a microprocessor, a multi-core microprocessor, graphics processor, etc.) electrically coupled through multi-layered graphene-based interconnects. In some embodiments, the SRAM is embedded as BEOL circuitry employing graphene-based TFETs including one or more PAH molecule, for example in accordance with embodiments described above. Any of controller 1235, PMIC 1230, or RF (radio frequency) integrated circuitry (RFIC) 1225 may include embedded graphene-based TFETs or graphene-based interconnects, for example in accordance with embodiments described above. Controller 1235, PMIC 1230, or RF (radio frequency) integrated circuitry (RFIC) 1225 may include FEOL graphene-based molecular circuitry and BEOL molecular graphene-based circuitry including one or more of the structures described elsewhere herein.

As further illustrated, in the exemplary embodiment, RFIC 1225 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these SoC modules may be integrated onto separate ICs coupled to a package substrate, interposer, or board.

Figure 13:
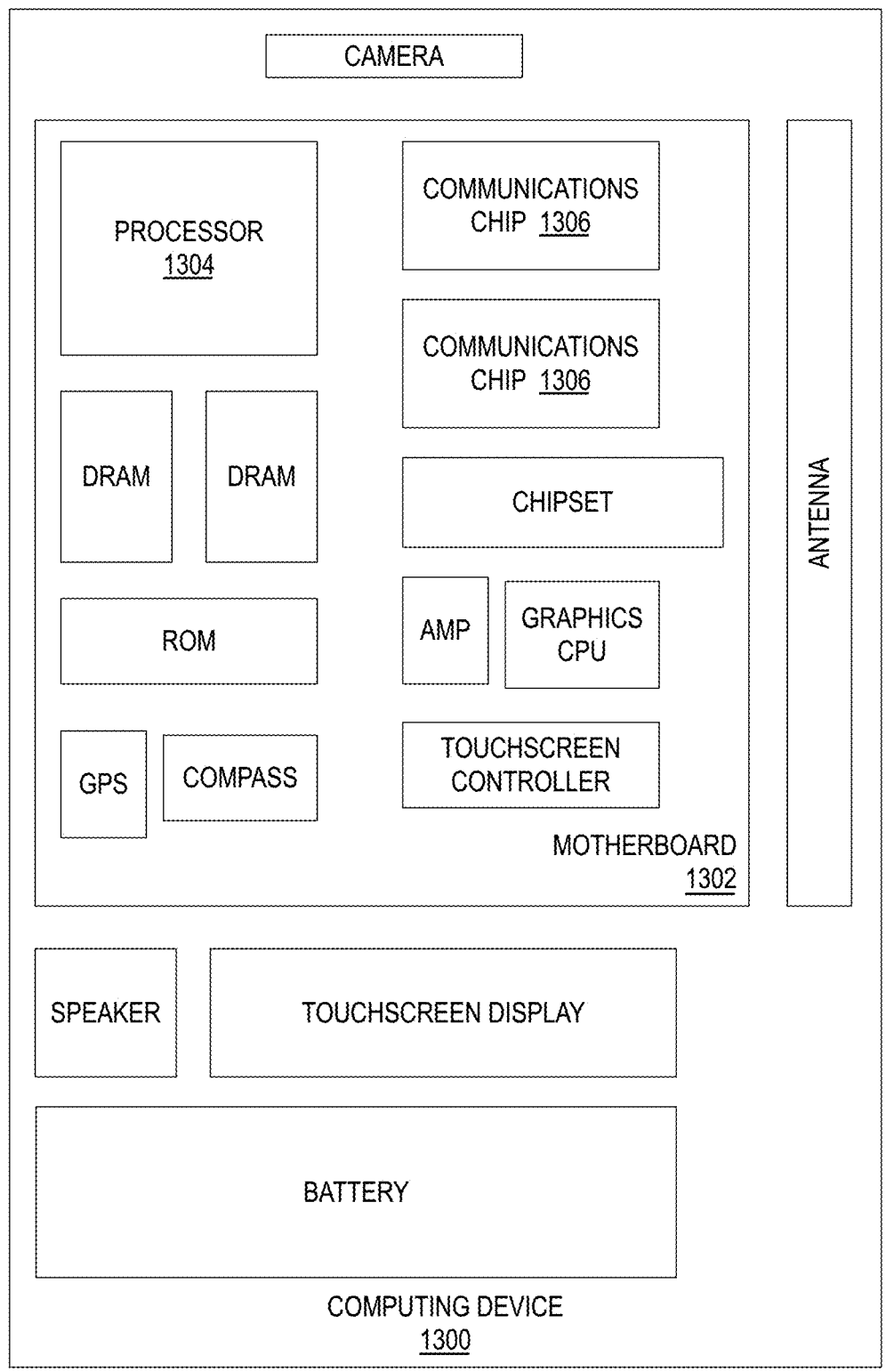
FIG. 13 is a functional block diagram illustrating an electronic computing device, in accordance with some embodiments.

FIG. 13 is a functional block diagram of a computing device 1300, arranged in accordance with at least some implementations of the present disclosure. Computing device 1300 may be found inside mobile platform 1205 or server machine 1206, for example. Device 1300 further includes a motherboard 1302 hosting a number of components, such as, but not limited to, a processor 1304 (e.g., an applications processor), which may further incorporate embedded graphene-based TFETs including one or more molecular graphene unit, for example in accordance with embodiments described above. Processor 1304 may be physically and/or electrically coupled to motherboard 1302. In some examples, processor 1304 includes an integrated circuit die packaged within the processor 1304. In general, the term "processor" or "microprocessor" may refer to any device or portion of a device that processes electronic data from registers and/or memory to transform that electronic data into other electronic data that may be further stored in registers and/or memory.

In various examples, one or more communication chips 1306 may also be physically and/or electrically coupled to the motherboard 1302. In further implementations, communication chips 1306 may be part of processor 1304. Depending on its applications, computing device 1300 may include other components that may or may not be physically and electrically coupled to motherboard 1302. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 1306 may enable wireless communications for the transfer of data to and from the computing device 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1306 may implement any of a number of wireless standards or protocols, including but not limited to those described elsewhere herein. As discussed, computing device 1300 may include a plurality of communication chips 1306. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that embodiments not limited to the illustrative embodiments described in detail herein, but can be practiced with modification and alteration without departing from the scope of the appended claims. For example the above embodiments may include specific combinations of features as further provided below:

In one or more first embodiments, a graphene-based transistor disposed over a substrate comprises a polycyclic aromatic hydrocarbon (PAH) molecule disposed over a substrate surface, wherein the PAH molecule has a lateral dimension in the plane of the substrate surface of at least 1 nm. The transistor further comprises a gate stack disposed over at least a portion of the PAH molecule, and two or more conductive source/drain terminals coupled to the PAH molecule.

In furtherance of the first embodiments, the PAH molecule extends between a plurality of template structures and the two or more conductive terminals intersect the PAH molecule at the template structures.

In furtherance of the first embodiments, the PAH molecule has six-fold rotational symmetry.

In furtherance of the first embodiments, the PAH molecule is $C_{54}H_{18}$, $C_{76}H_{20}$, or $C_{96}H_{24}$.

In furtherance of the first embodiments immediately above, the PAH molecule has a lateral dimension of at least 1.5 nm, occupies an area of the substrate that is at least 3 $nm^2$.

In furtherance of the first embodiments, the substrate comprises an anodic porous oxide, and the template structures comprise a two-dimensional array of nanometer diameter vias in the substrate.

In furtherance of the first embodiments immediately above, the PAH molecule is disposed between four or more nanometer diameter vias extending through the substrate.

In furtherance of the first embodiments immediately above, the anodic porous oxide comprises $Al_2O_3$ or ZnO, each of the conductive terminals comprises a conductive material disposed within a via and extending through the substrate thickness.

In furtherance of the first embodiments immediately above, the conductive material is a graphene foam comprising a composite of a polymeric material and molecular Graphene.

In furtherance of the first embodiments immediately above, further comprising metallized traces contacting the graphene foam and extending over a surface of the substrate opposite the substrate surface occupied by the PAH molecule.

In furtherance of the first embodiments immediately above, the metallized traces comprises a seed metal of TiN, W, Pd, Cu and/or Ru disposed at an interface of the graphene foam, and a trace comprising Cu extending between two or more seed metal surfaces, and the Cu trace is disposed within a dielectric comprising metal oxide in a polymer matrix.

In one or more second embodiments, a device comprising graphene-based interconnect traces includes a substrate, a two-dimensional (2D) array of template structures disposed on the substrate, and a linear array of polycyclic aromatic hydrocarbon (PAH) molecules disposed over a substrate surface between adjacent template structures, wherein the linear array comprises a two layers of the PAH molecules.

In furtherance of the second embodiments, the PAH molecule has six-fold rotational symmetry.

In furtherance of the second embodiments, the PAH molecule is $C_{54}H_{18}$, $C_{76}H_{20}$, or $C_{96}H_{24}$.

In furtherance of the second embodiments immediately above, the PAH molecule has a lateral dimension of at least 1.5 nm, occupies an area of the substrate that is at least 3 $nm^2$.

In furtherance of the second embodiments, wherein the linear array has a smallest lateral dimension of at least 1.5 nm and a longest lateral dimension of at least 100 nm.

In furtherance of the second embodiments, further comprising the transistor of claim 1, wherein each of the two or more conductive terminals comprise a linear array of PAH molecules coupled to the PAH molecule.

In one or more third embodiments, a method of fabricating a graphene-based transistor comprises forming a plurality of nanometer diameter through-substrate vias (TSVs) extending through an insulating substrate. The method further comprising depositing molecular graphene on a frontside substrate surface between the plurality of the TSVs, forming a gate stack over the molecular graphene, backfilling the TSVs with a conductive material from a backside of the substrate, and forming local source/drain interconnect on the substrate backside contacting conductive material in at least a pair of the TSVs.

In furtherance of the third embodiments, the molecular graphene is a polycyclic aromatic hydrocarbon (PAH) with six-fold rotational symmetry.

In furtherance of the third embodiments, the method further comprises forming the non-polar solution by forming PAH molecules by irradiating, with a DUV source, a precursor solution containing purified cyclohexane and hydroxylating the PAH molecules.

In furtherance of the third embodiments, forming the TSVs further comprises applying a polymer mixture over a metal substrate, patterning an array of vias in a mask material by directed self-assembly, and performing a masked anodic etch of the metal substrate.

In furtherance of the third embodiments, depositing the molecular graphene further comprises rendering a rim of the TSVs hydrophobic, forming aqueous hemispheres confined to the hydrophobic TSV rims, exposing the frontside substrate surface between the TSVs to a non-polar solution containing the molecular graphene, evaporating the aqueous hemispheres, and irradiating the non-polar solution with a UV source.

In furtherance of the third embodiments, backfilling the TSVs with conductive material further comprises spin casting a polymer loaded with nano-particles of graphene or molecular graphene.

In furtherance of the third embodiments, forming the local source/drain interconnect further comprises covering the backside of the substrate with a mixture of a sacrificial co-polymer and a composite material including nanoparticles of a metal oxide in a polymer matrix, promoting phase separation of the composite material and the sacrificial co-polymer, and curing the phase separated mixture by DUV irradiation.

In furtherance of the third embodiments immediately above, the sacrificial co-polymer comprises polyphathalate (PPTH) in propylene glycol methyl ether acetate (PGMEA), the metal oxide comprises $HfO_2$, and the polymer matrix comprises methylmethacrylate (MMA).

In one or more further embodiment, a method of fabricating a graphene-based interconnect line comprises forming a two-dimensional array of nanometer diameter through-substrate vias (TSVs) extending through an insulating substrate, depositing a plurality of PAH molecules onto substrate surface sites interstitial to the 2D array of TSVs to form a linear array of PAH molecules, and condensing one or more additional layer of molecular graphene over the linear array.

In furtherance of the fourth embodiments, the PAH molecules have six-fold symmetry.

In furtherance of the fourth embodiments immediately above, forming the 2D array of TSVs further comprises applying a polymer mixture over a metal substrate, patterning an array of vias in a mask material by directed self-assembly, and performing a masked anodic etch of the metal substrate.

In furtherance of the fourth embodiments, depositing the molecular graphene further comprises rendering a rim of the TSVs hydrophobic, forming aqueous hemispheres confined to the hydrophobic TSV rims, exposing the substrate surface between the TSVs to a non-polar solution containing the molecular graphene, evaporating the aqueous hemispheres, and irradiating the non-polar solution with a UV source.

In furtherance of the fourth embodiments immediately above, the method further comprises forming the non-polar solution by forming the PAH molecules by irradiating, with a DUV source, a precursor solution containing purified cyclohexane, and hydroxylating the PAH molecules.

In furtherance of the fourth embodiments, condensing one or more additional layer of molecular graphene further comprises re-exposing the substrate surface to the non-polar solution, evaporating the aqueous hemispheres, and irradiating the non-polar solution with a UV source.

However, the above embodiments are not limited in this regard and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A graphene-based transistor, comprising:
   a polycyclic aromatic hydrocarbon (PAH) molecule over a substrate surface, wherein the PAH molecule has a lateral dimension in the plane of the substrate surface of at least 1 nm, and wherein the PAH molecule extends between a plurality of vias through the substrate;
   a gate stack over at least a first portion of the PAH molecule; and
   a conductive source terminal and a drain terminal electrically coupled to, and in direct physical contact with, second and third portions of the PAH molecule, respectively, wherein the first portion of the PAH molecule is between the second and third portions of the PAH molecule, and wherein the conductive source terminal and a drain terminal intersect the PAH molecule at the vias.

2. The transistor of claim 1, wherein:
   the substrate comprises a porous oxide.

3. The transistor of claim 1, wherein the PAH molecule has six-fold rotational symmetry.

4. The transistor of claim 3, wherein the PAH molecule is $C_{54}H_{18}$, $C_{76}H_{20}$, or $C_{96}H_{24}$.

5. The transistor of claim 3, wherein the PAH molecule has a lateral dimension of at least 1.5 nm, occupies an area of the substrate that is at least 3 $nm^2$.

6. The transistor of claim 2, wherein the PAH molecule is between four or more vias extending through the substrate.

7. The transistor of claim 6, wherein:
   the porous oxide comprises at least one of $Al_2O_3$ or ZnO; and
   a conductive material is within each one of the vias, and extending through the entire substrate.

8. The transistor of claim 7, wherein the conductive material is a graphene foam comprising a composite of a polymeric material and molecular Graphene.

9. The transistor of claim 7, further comprising conductive interconnect structures in physical contact with the conductive material and extending over a surface of the substrate opposite the substrate surface occupied by the PAH molecule.

10. The transistor of claim 9, wherein:
    the conductive interconnect structures comprise a first metal of TiN, W, Pd, Cu, or Ru on an interface of the conductive material, and a second metal extending between two or more surfaces of the first metal; and
    wherein the second metal is within a dielectric comprising a metal oxide in a polymer matrix.

11. A device, comprising:
    a substrate;
    a two-dimensional (2D) array of vias through the substrate;

a linear array of polycyclic aromatic hydrocarbon (PAH) molecules over a substrate surface between adjacent ones of the vias, wherein the linear array comprises two layers of the PAH molecules, and individual ones of the PAH molecules within a first of the layers each have a first portion between second and third portions, the second portion in direct physical contact with a first of the vias and the third portion in direct physical contact with a second of the vias; and a gate electrode coupled to the first portion of the PAH molecules.

12. The device of claim 11, wherein the PAH molecule has six-fold rotational symmetry.

13. The device of claim 12, wherein the PAH molecule is $C_{54}H_{18}$, $C_{76}H_{20}$, or $C_{96}H_{24}$.

14. A method of fabricating a graphene-based transistor, the method comprising:

forming a plurality of through-substrate vias (TSVs) extending through an insulating substrate;

depositing a polycyclic aromatic hydrocarbon (PAH) molecule with six-fold rotational symmetry over a first substrate surface between the plurality of the TSVs, wherein a first portion of the PAH molecule is between a second portion and third portion of the PAH molecule, wherein the second portion of the PAH molecule is in direct physical contact with a first of the TSVs and wherein the third portion of the PAH molecule is in direct physical contact with a second of the TSVs;

forming a gate stack over the PAH molecule;

backfilling the TSVs with a conductive material from a second side of the substrate, opposite the first side; and forming a source and drain interconnect on the second side of the substrate, the source and drain interconnect contacting conductive material in at least a pair of the TSVs.

15. The method of claim 14, wherein forming the TSVs further comprises:

applying a polymer mixture over a metal substrate;

patterning an array of vias in a mask material by directed self-assembly; and performing a masked anodic etch of the metal substrate.

16. The method of claim 14, wherein depositing the PAH molecules further comprises:

rendering a rim of the TSVs hydrophobic;

forming aqueous hemispheres confined to the hydrophobic TSV rims;

exposing a surface on the first side of substrate between the TSVs to a non-polar solution containing the PAH molecule;

evaporating the aqueous hemispheres; and irradiating the non-polar solution with a UV source.

17. The method of claim 16, further comprising forming the non-polar solution by:

forming PAH molecules by irradiating, with a DUV source, a precursor solution containing cyclohexane; and hydroxylating the PAH molecules.

18. The method of claim 14, wherein backfilling the TSVs with conductive material further comprises spin casting a polymer loaded with nano-particles of graphene or PAH molecules.

* * * * *